United States Patent
Sohn et al.

(10) Patent No.: US 11,817,174 B2
(45) Date of Patent: Nov. 14, 2023

(54) MEMORY SYSTEM FOR ACCESS CONCENTRATION DECREASE MANAGEMENT AND ACCESS CONCENTRATION DECREASE METHOD

(71) Applicant: Samsung Electronics Co., Ltd., Suwon-si (KR)

(72) Inventors: Kyo Min Sohn, Yongin-si (KR); Dong Su Lee, Hwaseong-si (KR); Young Jin Cho, Seoul (KR); Hyung Woo Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 17/308,221

(22) Filed: May 5, 2021

(65) Prior Publication Data

US 2021/0272612 A1  Sep. 2, 2021

Related U.S. Application Data

(63) Continuation of application No. 13/840,723, filed on Mar. 15, 2013, now Pat. No. 11,024,352.
(Continued)

(30) Foreign Application Priority Data

Jul. 20, 2012 (KR) .................. 10-2012-0079581
Aug. 30, 2012 (KR) .................. 10-2012-0095591
(Continued)

(51) Int. Cl.
G11C 8/10        (2006.01)
G11C 11/406   (2006.01)
(Continued)

(52) U.S. Cl.
CPC ............ G11C 8/00 (2013.01); G06F 13/1668 (2013.01); G11C 8/10 (2013.01); G11C 11/40611 (2013.01)

(58) Field of Classification Search
CPC .... G11C 11/406; G11C 8/10; G11C 11/40611
(Continued)

(56) References Cited

U.S. PATENT DOCUMENTS 5,265,055 A   11/1993   Horiguchi et al.
5,459,690 A   10/1995   Rieger et al.
(Continued)

FOREIGN PATENT DOCUMENTS

EP   1 840 900 A1      10/2007
JP   H04-259984 A       9/1992
(Continued)

OTHER PUBLICATIONS

International Business Machines Corp. 1997 / Understanding Static RAM Operation.

*Primary Examiner* — Anthan Tran
(74) *Attorney, Agent, or Firm* — Muir Patent Law, PLLC

(57) ABSTRACT

A spatial disturbance that occurs when an access is concentrated in a specific memory area in a volatile semiconductor memory like DRAM is properly solved by a memory controller. The memory controller includes a concentration access detection part generating a concentration access detection signal when an address for accessing a specific memory area among memory areas of volatile semiconductor memory is concentratedly received. In the case that the concentration access detection signal is generated, the memory controller includes a controller for easing or preventing corruption of data which memory cells of the specific memory area and/or memory cells of memory areas adjacent to the specific memory area hold.

17 Claims, 39 Drawing Sheets

Related U.S. Application Data

(60) Provisional application No. 61/731,334, filed on Nov. 29, 2012, provisional application No. 61/731,313, filed on Nov. 29, 2012, provisional application No. 61/622,142, filed on Apr. 10, 2012.

(30) Foreign Application Priority Data

| Feb. 22, 2013 | (KR) | 10-2013-0019360 |
|---|---|---|
| Feb. 22, 2013 | (KR) | 10-2013-0019361 |

(51) Int. Cl.
  *G11C 8/00* (2006.01)
  *G06F 13/16* (2006.01)

(58) Field of Classification Search
  USPC ............................................. 365/200
  See application file for complete search history.

(56) References Cited

U.S. PATENT DOCUMENTS

| | | | |
|---|---|---|---|
| 5,617,365 | A | 4/1997 | Horiguchi et al. |
| 5,657,277 | A | 8/1997 | Shirley |
| 5,883,849 | A * | 3/1999 | Shirley ............... G11C 11/4096 365/201 |
| 5,953,267 | A | 9/1999 | Oh |
| 5,959,906 | A | 9/1999 | Song et al. |
| 6,005,813 | A | 12/1999 | Waller et al. |
| 6,049,505 | A | 4/2000 | Fister |
| 6,112,317 | A | 8/2000 | Berc et al. |
| 6,172,935 | B1 | 1/2001 | Wright et al. |
| 6,233,181 | B1 | 5/2001 | Hidaka |
| 6,240,033 | B1 | 5/2001 | Yang et al. |
| 6,285,616 | B1 | 9/2001 | Ikabata |
| 6,567,322 | B1 | 5/2003 | Mukai et al. |
| 6,639,854 | B2 | 10/2003 | Hur et al. |
| 6,944,074 | B2 | 9/2005 | Chung et al. |
| 7,116,591 | B2 | 10/2006 | Min et al. |
| 7,196,928 | B2 | 3/2007 | Chen |
| 7,289,344 | B2 | 10/2007 | Chen |
| 7,289,348 | B2 | 10/2007 | Chen |
| 7,319,634 | B2 | 1/2008 | Choo et al. |
| 7,379,369 | B2 | 5/2008 | Lee et al. |
| 7,512,001 | B2 | 3/2009 | Kwon et al. |
| 7,630,268 | B2 | 12/2009 | Eto |
| 7,734,866 | B2 | 6/2010 | Tsern |
| 7,830,742 | B2 | 11/2010 | Han |
| 7,990,767 | B2 | 8/2011 | Sharon et al. |
| 8,023,335 | B2 | 9/2011 | Kang |
| 8,069,297 | B2 | 11/2011 | Nishihara |
| 8,081,534 | B2 | 12/2011 | Kim |
| 8,139,417 | B2 | 3/2012 | Kim et al. |
| 8,209,588 | B2 | 6/2012 | Perlmutter et al. |
| 8,218,389 | B2 | 7/2012 | Hirobe |
| 8,223,583 | B2 | 7/2012 | Nakanishi et al. |
| 8,248,872 | B2 | 8/2012 | Kim |
| 8,612,798 | B1 | 12/2013 | Tsai |
| 2001/0050871 | A1 | 12/2001 | Takase et al. |
| 2002/0001246 | A1 | 1/2002 | Hidaka |
| 2002/0114198 | A1 | 8/2002 | Kato et al. |
| 2002/0124203 | A1 | 9/2002 | Fang |
| 2002/0126550 | A1 | 9/2002 | Sugio |
| 2002/0191467 | A1 | 12/2002 | Matsumoto et al. |
| 2003/0067825 | A1 | 4/2003 | Shimano et al. |
| 2003/0117872 | A1 | 6/2003 | Akamatsu |
| 2004/0022110 | A1 | 2/2004 | Haraguchi et al. |
| 2004/0083335 | A1 | 4/2004 | Gonzalez et al. |
| 2004/0085820 | A1 | 5/2004 | Taito |
| 2004/0107324 | A1 | 6/2004 | Nystuen |
| 2004/0139282 | A1 | 7/2004 | Yoshioka et al. |
| 2004/0141396 | A1 | 7/2004 | Ting et al. |
| 2004/0153732 | A1 | 8/2004 | Kamata |
| 2004/0169529 | A1 | 9/2004 | Afghahi et al. |
| 2004/0218431 | A1 | 11/2004 | Chung et al. |
| 2005/0057963 | A1 | 3/2005 | Ogura et al. |
| 2005/0111282 | A1 | 5/2005 | Dono et al. |
| 2005/0174873 | A1 | 8/2005 | Ferrant et al. |
| 2005/0195680 | A1 | 9/2005 | Higashi et al. |
| 2006/0050314 | A1 | 3/2006 | Shiga et al. |
| 2006/0069528 | A9 | 3/2006 | Akutsu |
| 2006/0176749 | A1 | 8/2006 | Dono et al. |
| 2006/0262625 | A1 * | 11/2006 | Dono ............... G11C 11/40611 365/222 |
| 2007/0058427 | A1 | 3/2007 | Okhonin et al. |
| 2007/0064489 | A1 | 3/2007 | Bauser |
| 2007/0070764 | A1 | 3/2007 | Miyamoto et al. |
| 2007/0097761 | A1 | 5/2007 | Sunaga |
| 2007/0103978 | A1 | 5/2007 | Conley et al. |
| 2007/0147145 | A1 | 6/2007 | Koo |
| 2007/0180202 | A1 | 8/2007 | Kawabata et al. |
| 2007/0237016 | A1 | 10/2007 | Miyamoto et al. |
| 2008/0010435 | A1 | 1/2008 | Smith et al. |
| 2008/0016427 | A1 | 1/2008 | Namekawa et al. |
| 2008/0082735 | A1 | 4/2008 | Shiga |
| 2008/0144417 | A1 | 6/2008 | Eguchi et al. |
| 2008/0151670 | A1 | 6/2008 | Kawakubo et al. |
| 2008/0165605 | A1 | 7/2008 | Fisch et al. |
| 2008/0266990 | A1 | 10/2008 | Loeffler |
| 2009/0103379 | A1 | 4/2009 | Zhang et al. |
| 2009/0122949 | A1 | 5/2009 | Reid et al. |
| 2009/0147596 | A1 | 6/2009 | Shiah |
| 2009/0168525 | A1 | 7/2009 | Olbrich et al. |
| 2009/0201752 | A1 | 8/2009 | Riho et al. |
| 2009/0271567 | A1 | 10/2009 | Huang |
| 2010/0070696 | A1 | 3/2010 | Blankenship |
| 2010/0085815 | A1 | 4/2010 | Ko et al. |
| 2010/0157656 | A1 | 6/2010 | Tsuchida |
| 2010/0161880 | A1 | 6/2010 | You |
| 2011/0125982 | A1 | 5/2011 | Choi et al. |
| 2011/0176371 | A1 | 7/2011 | Jang et al. |
| 2011/0194367 | A1 | 8/2011 | Wong et al. |
| 2011/0216614 | A1 | 9/2011 | Hosoe |
| 2011/0235434 | A1 | 9/2011 | Byom et al. |
| 2011/0267915 | A1 | 11/2011 | Son et al. |
| 2011/0289293 | A1 | 11/2011 | Kawamura et al. |
| 2011/0303959 | A1 | 12/2011 | Mitchell et al. |
| 2012/0106281 | A1 | 5/2012 | Kim et al. |
| 2012/0317352 | A1 | 12/2012 | Kang et al. |
| 2013/0094320 | A1 | 4/2013 | Yoo et al. |
| 2013/0097403 | A1 | 4/2013 | Zheng et al. |
| 2013/0268727 | A1 | 10/2013 | Sohn et al. |
| 2014/0006704 | A1 | 1/2014 | Greenfield et al. |
| 2014/0115296 | A1 | 4/2014 | Diep et al. |
| 2014/0219043 | A1 | 8/2014 | Jones et al. |
| 2019/0228810 | A1 | 7/2019 | Jones et al. |

FOREIGN PATENT DOCUMENTS

| | | |
|---|---|---|
| JP | H07-78485 A | 3/1995 |
| JP | H1166869 A | 3/1999 |
| JP | H11-250694 A | 9/1999 |
| JP | 2002-352595 A | 12/2002 |
| JP | 2003-288794 A | 10/2003 |
| JP | 2004-157686 A | 6/2004 |
| JP | 2007-141883 | 6/2007 |
| JP | 2008-123241 A | 5/2008 |
| JP | 2008-287803 A | 11/2008 |
| KR | 10-1999-0000474 A | 1/1999 |
| KR | 10-0212135 B1 | 2/1999 |
| KR | 10-0248165 B1 | 3/2000 |
| KR | 10-2000-0062452 A | 10/2000 |
| KR | 10-2002-0080472 A | 10/2002 |
| KR | 10-2004-0069895 A | 8/2004 |
| KR | 10-2005-0117722 A | 12/2005 |
| KR | 2007-0035436 A | 3/2007 |
| KR | 10-2007-0056989 A | 6/2007 |
| KR | 10-2007-0062077 A | 6/2007 |
| KR | 10-2007-0069878 A | 7/2007 |
| KR | 10-2007-0107415 A | 11/2007 |
| KR | 2007-0115260 A | 12/2007 |
| KR | 20080070248 A | 7/2008 |
| KR | 2009-0094333 A | 9/2009 |
| KR | 10-2009-0106221 A | 10/2009 |

(56) References Cited

FOREIGN PATENT DOCUMENTS

| KR | 10-2010-0070025 A | 6/2010 |
| KR | 10-2010-0124593 A | 11/2010 |
| KR | 10-2011-0104108 A | 9/2011 |
| KR | 10-2012-0004686 A | 1/2012 |
| KR | 10-2012-0048723 A | 5/2012 |

* cited by examiner

| Case 1 | MPR Write Function | ~4a |
| --- | --- | --- |
| Case 2 | MRS + CRA | ~4b |
| Case 3 | MRS + CRArepeat | ~4c |
| Case 4 | MRS + CRA +[CRA+1] + [CRA-1] | ~4d |

Fig. 31

| Encoding | | RRA<br><5> | RRA<br><4> | RRA<br><3> | RRA<br><2> |
|---|---|---|---|---|---|
| SWLi<br>(i=0~15) | SWL0 | 0 | 0 | 0 | 0 |
| | SWL1 | 0 | 0 | 0 | 1 |
| | SWL2 | 0 | 0 | 1 | 0 |
| | SWL3 | 0 | 0 | 1 | 1 |
| | | | | | |
| | SWL15 | 1 | 1 | 1 | 1 |

MEMORY SYSTEM FOR ACCESS CONCENTRATION DECREASE MANAGEMENT AND ACCESS CONCENTRATION DECREASE METHOD

CROSS-REFERENCE TO RELATED APPLICATIONS

This U.S. non-provisional patent application is a continuation of U.S. patent application Ser. No. 13/840,723, filed Mar. 15, 2013, which claims priority under 35 U.S.C. § 119 to U.S. provisional application No. 61/622,142, filed on Apr. 10, 2012, U.S. provisional application No. 61/731,334, filed on Nov. 29, 2012, and U.S. provisional application No. 61/731,313, filed on Nov. 29, 2012 and to Korean Patent Application No. 10-2012-0079581, filed on Jul. 20, 2012, Korean Patent Application No. 10-2012-0095591, filed on Aug. 30, 2012, Korean Patent Application No. 10-2013-0019360, filed on Feb. 22, 2013, and Korean Patent Application No. 10-2013-0019361, filed on Feb. 22, 2013, in the Korean Intellectual Property Office, the disclosures of all of which are incorporated by reference herein in their entireties.

BACKGROUND

The present disclosure herein relates to the field of preventing or easing cell data corruption of a volatile semiconductor memory, and more particularly, to a memory system for an access concentration decrease management of a specific word line or bit line of a semiconductor memory device and an access concentration decrease method.

A volatile semiconductor memory device such as a dynamic random access memory (DRAM) is being widely used in an electronic device such as a mobile device or a computer as a main memory.

A memory system including a semiconductor memory device and a memory controller may be embedded in or connected to a host device such as a microprocessor.

In a memory system, in the case that the number of times a specific word line or bit line is accessed is far more than that of other word lines or bit lines, data retention reliability of memory cells connected to adjacent word lines of the specific word line or memory cells connected to adjacent bit lines of the specific bit line may be relatively degraded.

For example, in the case that a specific address is concentratedly applied to a semiconductor memory, data stability of memory cells connected to a word line or bit line which the specific address indicates or memory cells adjacent to the memory cells may be degraded. This is because if coupling or well bias is changed in a semiconductor memory such as a DRAM, the quantity of charges charged in a storage capacitor is changed. Data representing 1 or 0 in a semiconductor memory such as a DRAM is determined by the quantity of charges of a storage capacitor constituting a memory cell. As a manufacturing process of DRAM is miniaturized, if an access is concentrated on a specific word line, memory cells connected to adjacent word lines of the specific word line may be disturbed or access transistors connected to the specific word line may be under stress. Thus, data retention time of memory cells is reduced and thereby a refresh characteristic may get worse.

In the DRAM, by request of high speed, high capacity and low power consumption, a space between word lines, a space between bit lines and a space between memory cells are increasingly being reduced.

Thus, when memory cells connected to any word line are accessed, memory cells connected to word lines adjacent to the word line being accessed suffer spatial disturbance due to a coupling effect. In the case that an access to a specific word line concentratedly occurs, cell data stored in memory cells connected to the adjacent word lines are liable to corruption. For instance, a memory cell storing data "1" may be read as "0", or a memory cell storing data "0" may be read as "1".

If corruption of cell data occurs due to a concentration access to a specific word line or a specific memory area, a critical error of a data storage device may occur.

There may be an increase in a dynamic coupling occurring when an access concentratedly performed to a specific word line and an increase in interference due to an electric field as reasons that a refresh characteristic is degraded due to degradation of retention characteristic.

In a DRAM, in the case that a normal word line is tested to be failed and is repaired by a spare word line, it is necessary to care adjacent spare word lines physically adjacent to the spare word line.

However, since the failed normal word line is randomly or flexibly replaced with one of a plurality of spare word lines, it is difficult to accurately obtain addresses of spare word lines physically adjacent the spare word line.

SUMMARY

Embodiments of the disclosure provide a memory controller. The memory controller may include a concentration access detector generating a concentration detection signal when concentratedly receiving an address for accessing a specific memory area among memory areas of volatile semiconductor memory; and a controller preventing or mitigating corruption of data of memory cells of the specific memory area or memory cells of memory areas adjacent to the specific memory area when the concentration access detection signal is generated.

Embodiments of the disclosure also provide a memory controller. The memory controller may include a concentration access detector generating a concentration access detection signal when a row address accessing a specific word line among word lines of a volatile semiconductor memory is concentratedly received; a refresh counter outputting a high speed auto refresh period faster than a setting-up normal auto refresh period when the concentration access detection signal is generated; and a controller controlling in response to an output of the refresh counter so that memory cells connected to the specific word line are refreshed in the high speed auto refresh period to prevent or ease corruption of data of memory cells connected to the specific word line.

Embodiments of the disclosure also provide a memory controller. The memory controller may include a concentration access detector generating a concentration access detection signal when a row address accessing a specific word line among word lines of a volatile semiconductor memory is concentratedly received; a refresh counter outputting a high speed auto refresh period faster than a setting-up normal auto refresh period when the concentration access detection signal is generated; and a controller controlling in response to an output of the refresh counter so that memory cells connected to word line adjacent to the specific word line are refreshed in the high speed auto refresh period to prevent or ease corruption of data of memory cells connected to the word lines adjacent to the specific word line.

Embodiments of the disclosure also provide an access concentration decrease method. The access concentration decrease method may include checking whether an address for accessing a specific memory area among memory areas of volatile semiconductor memory is concentratedly received and generating a concentration access detection signal if the address is concentratedly received; and preventing corruption of data of memory cells of the specific memory area and/or memory cells of memory areas adjacent to the specific memory area by solving an address concentration on the specific memory area.

Embodiments of the disclosure also provide a semiconductor memory device. The semiconductor memory device may include a semiconductor memory cell array; and a concentration address processing part refreshing word lines adjacent to the specific word line in response to a concentration address detection signal being applied when an address concentratedly occurs which accesses a specific word line of a semiconductor memory cell array.

Embodiments of the disclosure also provide a memory controller. The memory controller may include an address transform part receiving a logic address being applied to transform the logic address into a physical address for an access of a semiconductor memory device; a monitoring part receiving the physical address and a command signal to monitor whether a specific word line of the semiconductor memory device is concentratedly accessed; and a control logic receiving the logic address and a memory request signal, and applying a concentration address detection signal to the semiconductor memory device when an output result of the monitoring part is expressed to be a concentration access to ease stress or disturbance from which memory cells connected to word lines adjacent to the specific word line will suffer.

Embodiments of the disclosure also provide a concentration address caring method. The concentration address caring method may include monitoring whether an address repeatedly selecting any word line or any bit line of a semiconductor memory is generated more than the previously set number of times; and preventing or easing stress or disturbance from which memory cells connected to word lines adjacent to any word line or memory cells connected to word lines adjacent to any bit line will suffer in the case that the address is generated more than the previously set number of times.

Embodiments of the disclosure also provide a concentration address caring method. The concentration address caring method may include receiving a concentration detection signal being applied when a row address accessing a specific word line of a semiconductor memory cell array concentratedly occurs; activating word lines adjacent to the specific word line; and refreshing memory cells connected to the adjacent word line.

Embodiments of the disclosure also provide a semiconductor memory device. The semiconductor memory device may include a spare line address encoding circuit generating a spare line address which encodes spare line enable signals being applied when a spare line replacing a normal line is activated to indicate a physical location of the spare line being activated; and an adjacent address generator generating spare line adjacent addresses which receive the spare line address to activate spare lines physically adjacent to the activated spare line.

Embodiments of the disclosure also provide a semiconductor memory device. The semiconductor memory device may include a memory cell array comprising a normal memory cell array and a spare memory cell array configured to replace a memory cell with a spare memory cell connected to a spare word line when the normal cell connected to a normal word line of the normal memory cell array is proved to be failed; a row decoder decoding a row pre-decoding signal to activate one of the normal word line and the spare word line; an address encoding circuit encoding spare word line enable signals which activate the spare word line when the spare word line is activated to generate a spare word line address indicating a physical location of the spare word line; and an adjacent address generator receiving the spare word line address to generate spare word line adjacent addresses activating spare word lines physically adjacent to the activated spare word line.

Embodiments of the disclosure also provide a semiconductor memory device. The semiconductor memory device may include a memory cell array comprising a normal memory cell array and a spare memory cell array that are comprised of volatile memory cells; and an adjacent row address generator generating row addresses of word lines physically adjacent to a specific word line using a concentration row address when the specific word line of the memory cell array is concentratedly accessed by the concentration row address.

Embodiments of the disclosure also provide a semiconductor memory device. The semiconductor memory device may a memory cell array comprising a normal memory cell array and a spare memory cell array that are comprised of volatile memory cells; an address input buffer buffering a row address to output the buffered row address; an adjacent row address generator generating row addresses of word lines physically adjacent to a specific word line using a concentration row address when the concentration row address concentratedly accessing the specific word line of the memory cell array is output from the address input buffer; a pre-decoder pre-decoding one of the row address being output from the address input buffer and a row address of the adjacent word lines being output from the adjacent row address generator to output the pre-decoded one as a row pre-decoding signal; and a row decoder configured to activate at least one of selected word lines of the memory cell array by decoding the row pre-decoding signal.

BRIEF DESCRIPTION OF THE FIGURES

Preferred embodiments of the disclosure will be described below in more detail with reference to the accompanying drawings.

FIG. 31 is an illustrative drawing of an encoding output of the encoder of FIG. 25.

DETAILED DESCRIPTION

Figure 1:
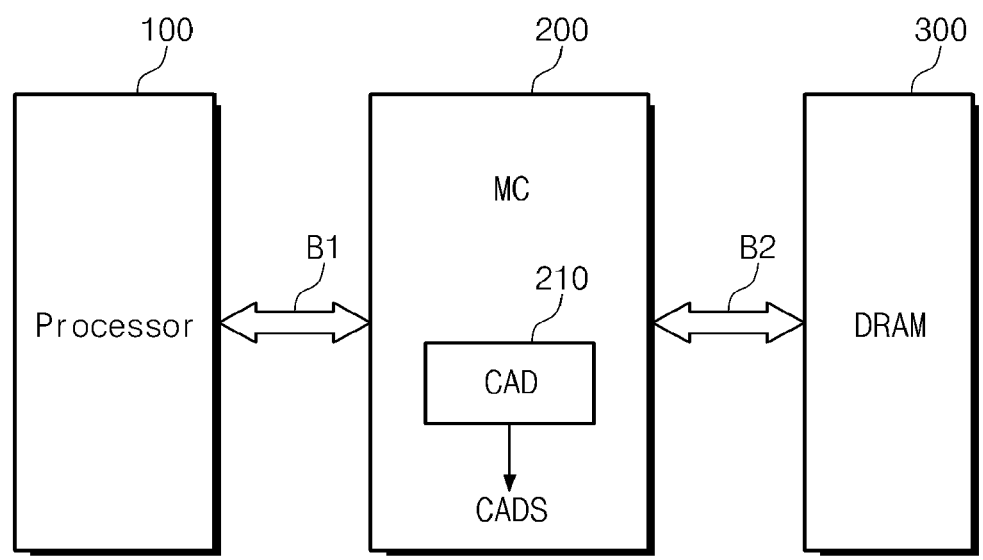
FIG. 1 is an exemplary block diagram illustrating a connection constitution of memory controller in accordance with some embodiments.

Embodiments of present disclosure will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is an exemplary block diagram illustrating a connection constitution of memory controller in accordance with some embodiments.

Referring to FIG. 1, a memory controller 200 includes a concentration access detector (CAD) 210. The memory controller 200 may be connected to a processor 100 through a bus (B1) and may be connected to a DRAM 300 through a bus (B2). The memory controller 200 may be embedded in the processor 100.

The concentration access detector 210 in the memory controller 200 generates a concentration access detection signal (CADS) when concentratedly receiving an address for accessing a specific memory area among memory areas of the DRAM 300 from the processor 100.

The concentration access detector 210 searches a memory area (or word line) or memory areas (or word lines) having the large number of times of access during a set-up time or during a plurality of set-up operation cycles. That search can be accomplished by counting the number of times the same addresses are applied after comparing a row address, a column address and a block or bank address being applied now with a row address, a column address and a block or bank address applied before. Thus, if the number of times an address is frequently applied exceeds a previously set threshold value, the concentration access detection signal (CADS) is generated.

The memory controller 200, if the concentration access detection signal (CADS) is generated, may include a controller (230 of FIG. 3) preventing or mitigating corruption of data that exist in memory cells of the specific memory area or memory cells of memory areas adjacent to the specific memory area.

Figure 2:
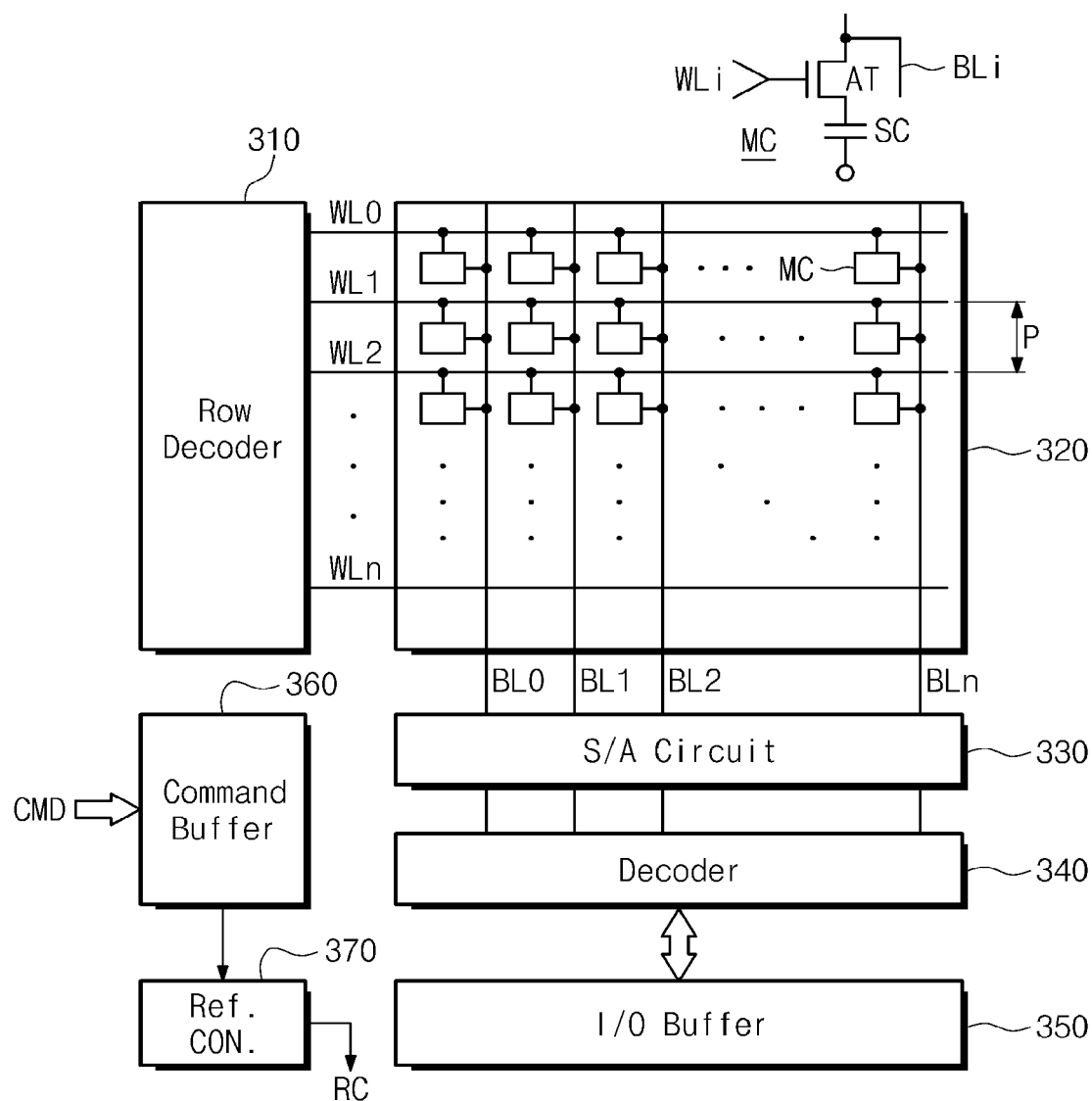
FIG. 2 is a schematic circuit block diagram of DRAM of FIG. 1.

FIG. 2 is a circuit block diagram of DRAM of FIG. 1.

Referring to FIG. 2, the DRAM 300 may include a row decoder 310, a memory cell array 320, a sense amplifier circuit 330, a column decoder 340, an input/output buffer 350, a command buffer 360 and a refresh control circuit 370.

The DRAM 300 is a conventional DRAM.

The memory cell array 320 includes a plurality of memory cells having a matrix form of row and column. Each memory cell MC is comprised of one access transistor AT and one storage capacitor SC. A gate of the access transistor AT is connected to a corresponding word line WLi. A drain of the access transistor AT is connected to a corresponding bit line BLi. A plurality of memory cells connected to the same word line forms a memory page.

A state of cell data is determined by the amount of charges stored in the storage capacitor SC. Since charges stored in the storage capacitor SC leak as time passes, a refresh operation restoring data before a state of cell data is changed is needed in the DRAM 300.

The row decoder 310 decodes a row address to select a row line (word line) of the memory cell array 320.

The column decoder 320 decodes a column address to select a column line (bit line) of the memory cell array 320.

The sense amplifier 330 senses and amplifies data of a memory cell on the bit line.

The input/output buffer 350 buffers light data being applied from the outside to store the buffered write data in a selected memory cell and buffers data read from a memory cell to output the data to the outside.

The command buffer 360 buffers a command (CMD) applied from the outside. The command is decoded so that an operation of the DRAM 300 is performed according to the command.

The refresh control circuit 370 generates a refresh control signal (RC) so that the memory cells are refreshed.

The DRAM 300 performs an auto refresh when a memory access operation is performed and performs a self refresh when a standby operation is performed.

As a design rule is reduced, a distance P between word lines WL0 through WLn to which memory cells of the memory cell array 320 are connected is gradually reduced. In the case that a specific word line is relatively and frequently accessed as compared with other word lines, fatigue failure of the specific word line may be incurred. Data of memory cells connected to the specific word line WL1 may be corrupted.

Data of memory cells connected to word lines adjacent to the specific word line may be corrupted by a spatial disturbance caused by a coupling effect.

To prevent or ease corruption of cell data, the memory controller 200 may have constitutions and functions of FIGS. 3 through 7.

Figure 3:
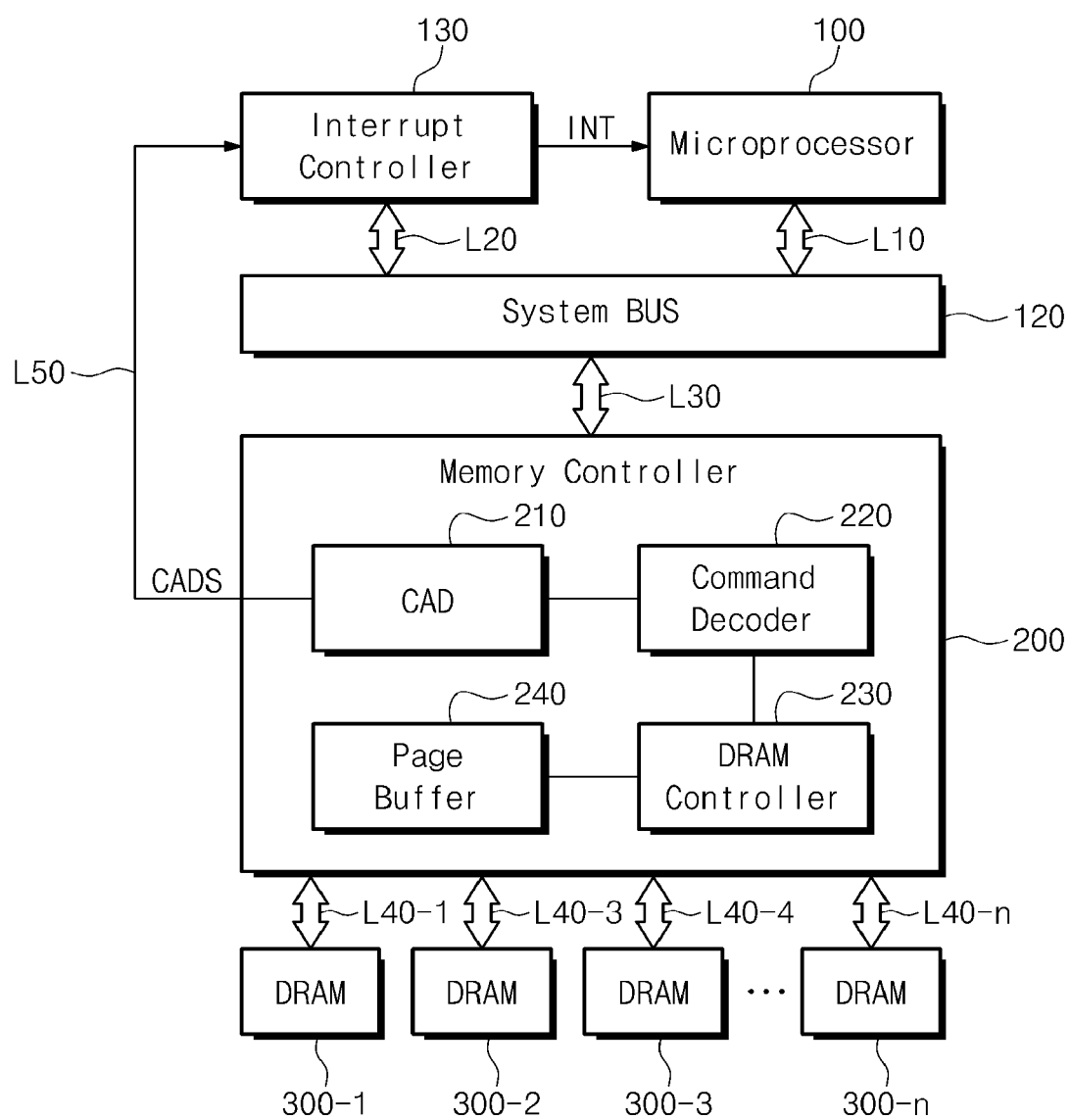
FIG. 3 is an exemplary detailed block diagram of some embodiments in accordance with FIG. 1.

FIG. 3 is an exemplary detailed block diagram of some embodiments in accordance with FIG. 1.

Referring to FIG. 3, the memory controller 200 may include the concentration access detector 210, a command decoder 220, a controller 230, and a page buffer 240 (or register).

The memory controller 200 applies an interrupt signal to the processor 100 when the concentration access detection signal (CADS) is generated. The interrupt signal may be the concentration access detection signal (CADS) and may be provided to an interrupt controller 130 through a line L50. In the case that the memory controller 200 is embedded in the processor 100, the interrupt controller 130 may be formed in the memory controller 200.

The microprocessor 100 receives an interrupt request signal INT from the interrupt controller 130. The microprocessor 100 changes an address allocation using a software method or a firmware method when receiving the interrupt request signal INT.

The changed address allocation is applied to the memory controller 200 through a system bus 120 existing between L10 and L30. When a concentration access detection signal (CADS) is generated, an access concentrated on a specific memory area is avoided by the address allocation change that the processor performs using a firmware method or a software method.

If an access is concentrated on a specific word line WL1 of FIG. 2, other word line (e.g., WLn) is accessed by the address allocation change.

Since by the software address change due to an interruption, data of memory cells connected to word lines WL0 and WL2 adjacent to the specific word line WL1 is free from a spatial disturbance due to a coupling effect, it is difficult that the data is corrupted. For example, data corruption is prevented or minimized.

In FIG. 3, when the concentration access detection signal is generated, the interrupt signal is not immediately applied to the interrupt controller 130 and may be stored in an internal register such as the page buffer 240. Accordingly, the interrupt controller 130 which checked the internal register outputs the interrupt request signal INT to the microprocessor 100 when the interrupt signal exists.

Similarly, the microprocessor 100 changes an address allocation using a software method or a firmware method when receiving the interrupt request signal INT. The changed address allocation is applied to the memory controller 200 through the system bus 120 existing between the lines L10 and L130.

In that case, when generating the concentration access detection signal (CADS), the processor changes the address allocation using a software method or a firmware method. Thus, an access concentrated on a specific memory area such as a word line, a bit line or a memory bank is avoided.

Since the specific memory area is not accessed any more, corruption of data of memory cells connected to word lines adjacent to the specific word line is prevented or minimized.

Since a solution of access concentration problem in an application program level is to reallocate a corresponding cache or a buffer using a software method, an installation of hardware is not needed or minimized.

Figure 4:
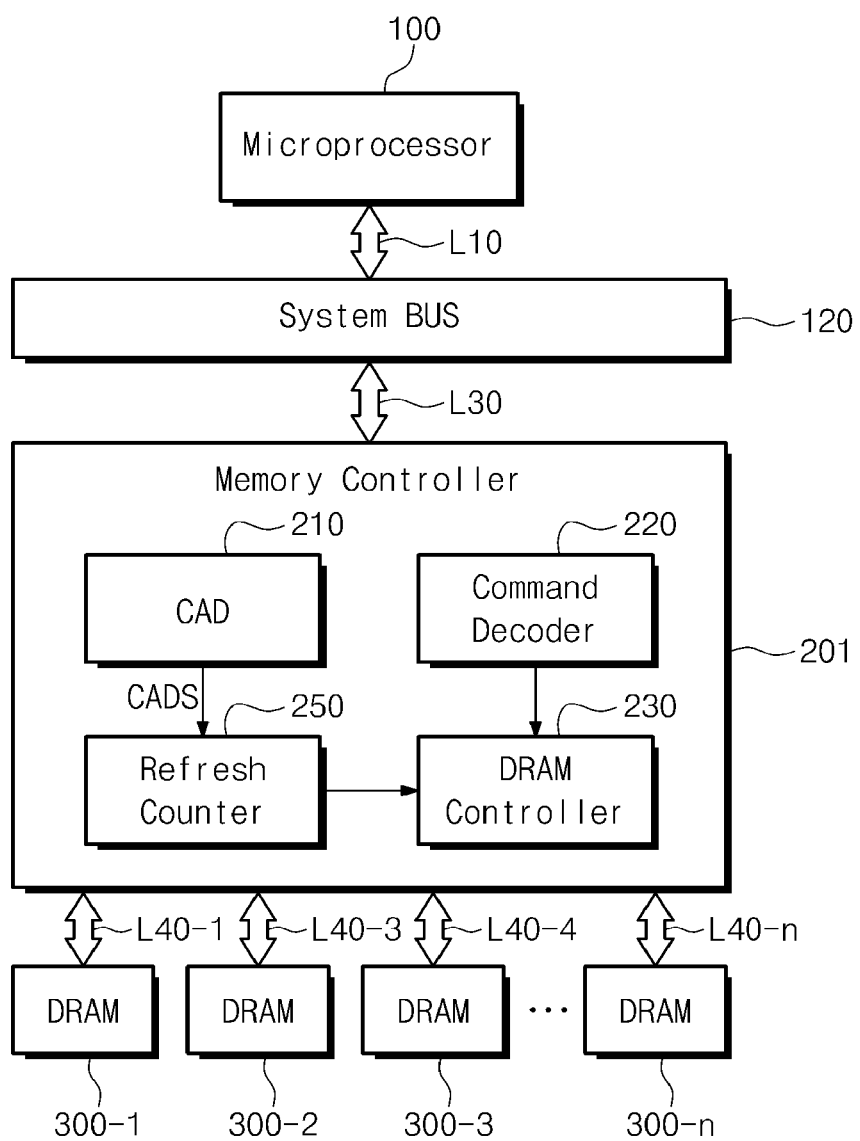
FIG. 4 is an exemplary detailed block diagram of some other embodiments in accordance with FIG. 1.

FIG. 4 is an exemplary detailed block diagram of some other embodiments in accordance with FIG. 1.

Referring to FIG. 4, a memory controller 201 may include the concentration access detector 210, the command decoder 220, the DRAM controller 230 and a refresh counter 250.

When a concentration access detection signal is generated from the concentration access detector 210, the memory controller 201 controls an auto refresh period for auto-refreshing a memory including an access concentration specific memory area among memory areas of the DRAM 300-i through the refresh counter 250 more rapidly than a normal auto refresh period.

In FIG. 4, assume that the microprocessor 100 applies a physical address concentratedly accessing a word line (WL1 of FIG. 2) of the DRAM 300-1 through the system bus 120.

The concentration access detector 210 of the memory controller 201 generates a concentration access detection signal (CADS). The refresh counter 250 outputs an auto refresh counting signal that an auto refresh period is rapidly controlled as much as a specific ratio in response to the concentration access detection signal (CADS). The DRAM controller 230 applies an auto refresh command to the command buffer 360 of the DRAM 300-1 according to the auto refresh counting signal. When a concentration access detection signal is generated, an auto refresh period of volatile memory including the word line (WL1 of FIG. 2) of the DRAM 300-1 becomes shorter than a normal auto refresh period. Since an address is concentrated and correspondingly an auto refresh operation is frequently performed, corruption of cell data is prevented.

Accordingly, regardless of an address concentration of the corresponding word line, states of cell data of a plurality of memory cells connected to the word line (WL1 of FIG. 2) of the DRAM 300-1 can be more safely maintained.

Figure 5:
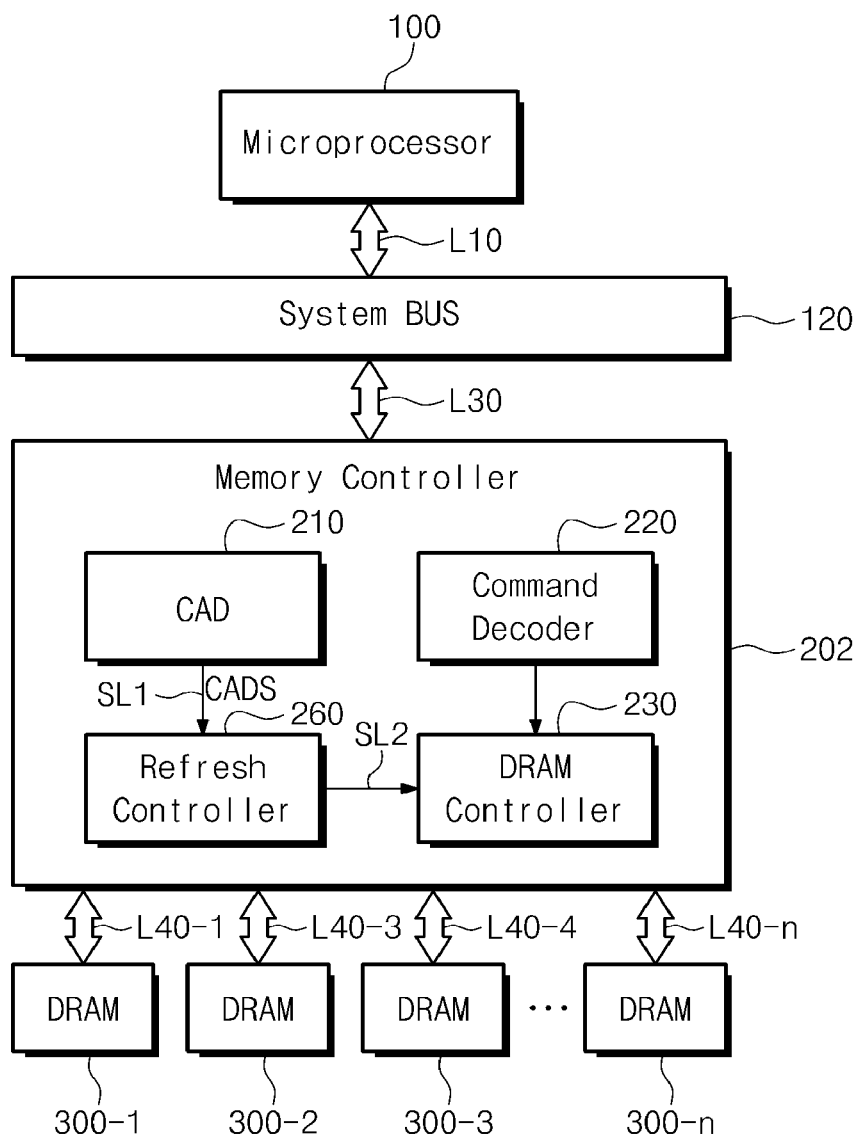
FIG. 5 is an exemplary detailed block diagram of some other embodiments in accordance with FIG. 1.

FIG. 5 is an exemplary detailed block diagram of some other embodiments in accordance with FIG. 1.

Referring to FIG. 5, a memory controller 202 may include the concentration access detector 210, the command decoder 220, the DRAM controller 230 and a refresh controller 260.

When a concentration access detection signal is generated from the concentration access detector 210, the memory controller 202 can do so that a refresh command for refreshing a memory area adjacent to the specific memory area of the DRAM 300-i is generated through the refresh controller 260. In this case, a word line address of the memory area adjacent to the specific memory area is provided.

When a concentration access detection signal is generated from the concentration access detector 210, the memory controller 202 can induce so that a memory area adjacent to the specific memory area of the DRAM 300-i is refreshed through the refresh controller 260. The DRAM controller 230 controls so that a word line of the memory area adjacent to the specific memory area is activated and controls so that a bit line of the memory area adjacent to the specific memory area is precharged and thereby a refresh operation is performed on the memory area adjacent to the specific memory area.

In FIG. 5, assume that the microprocessor 100 applies a physical address concentratedly accessing the word line (WL1 of FIG. 2) of the DRAM 300-1 through the system bus 120.

The concentration access detector 210 of the memory controller 202 generates a concentration access detection signal (CADS). The refresh controller 260 outputs a refresh control signal through a line SL2 in response to the concentration access detection signal (CADS). The DRAM controller 230 applies a refresh command with respect to adjacent word lines to the command buffer 360 of the DRAM 300-1 according to the refresh control signal. When the concentration access detection signal is generated, word lines WL0 and WL2 adjacent to the word line (WL1 of FIG. 2) of the DRAM 300-1 are refreshed. An address is concentrated and correspondingly the word lines WL0 and WL2 adjacent to the word line WL are refreshed.

In the case that an access is concentrated on a specific word line, since memory cells connected to the word lines WL0 and WL2 adjacent to the word line WL1 are free from a spatial disturbance or become robust, corruption of cell data is prevented or minimized.

When a refresh operation is performed on the word lines WL0 and WL2 adjacent to the word line WL1, a plurality of memory cells connected to the word line WL1 of the DRAM 300-1 may be refreshed together with the word lines WL0 and WL2 adjacent to the word line WL1.

Figure 6:
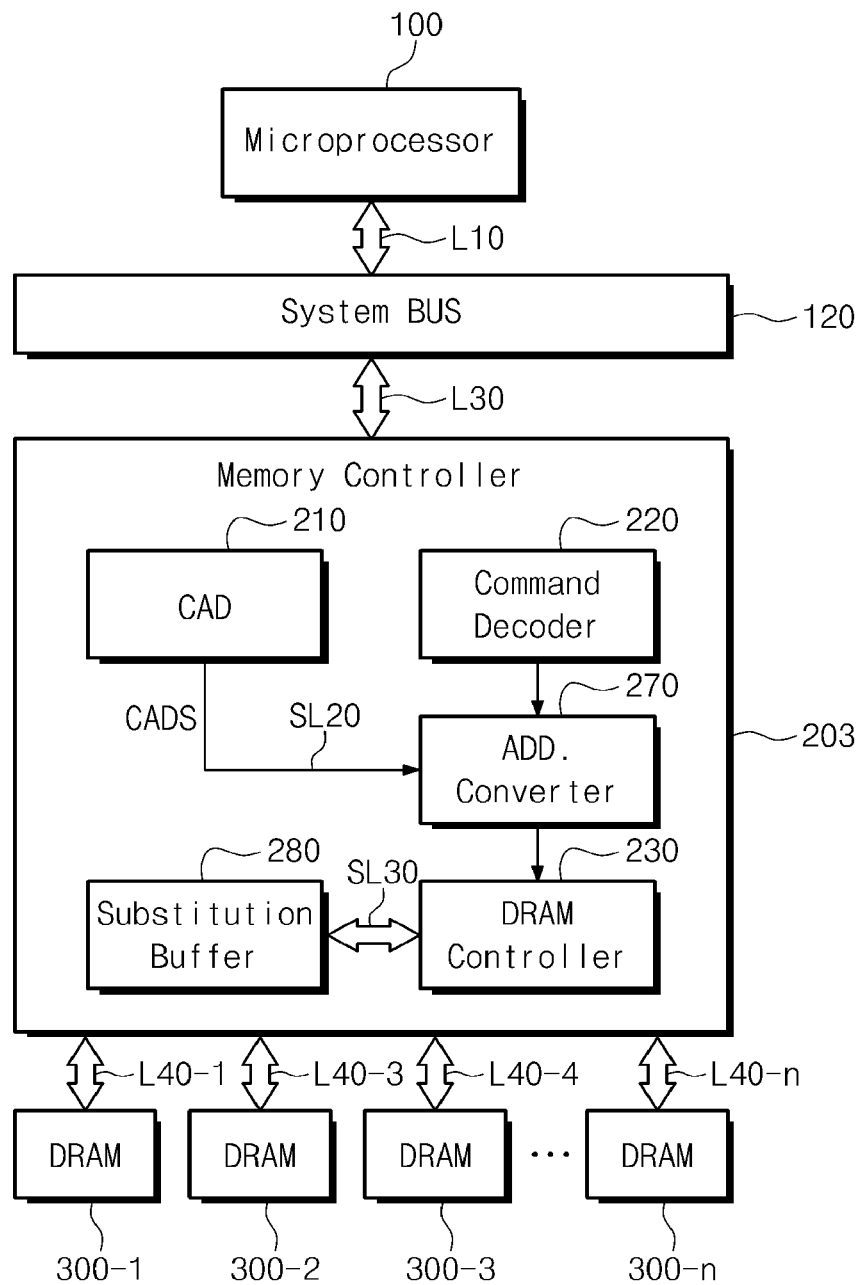
FIG. 6 is an exemplary detailed block diagram of some other embodiments in accordance with FIG. 1.

FIG. 6 is an exemplary detailed block diagram of some other embodiments in accordance with FIG. 1.

Referring to FIG. 6, a memory controller 203 may include the concentration detector 210, the command decoder 220, the DRAM controller 230, an address converter 270 and a substitution buffer 280.

When a concentration access detection signal is generated from the concentration access detector 210, the memory controller 203 performs a data swapping operation. The DRAM controller 230 reads data stored in memory cells connected to an access concentrated specific word line WL1 of the DRAM 300-i to store the data in the substitution buffer 280. The DRAM controller 230 reads data stored in memory cells connected to a word line WLn on which an access is not concentrated to store the data in the substitution buffer 280. The data stored in the substitution buffer 280 are swapped, and then are stored in memory cells connected to memory cells connected to the specific word line WL1 and memory cells connected to the word line WLn.

After a swapping operation is completed, the DRAM controller 230 switches a row address of the specific word line WL1 with a row address of the word line WLn through the address converter 270. The DRAM controller 230 performs an address remapping so that the word line WLn is selected when a row address selecting the specific word line WL1 is applied.

A data swapping may be performed between rows in the same memory bank and may be performed between rows in different memory banks. It is desirable that a word line being substituted is not spatially adjacent to a word line for substitution.

In FIG. 6, assume that the microprocessor 100 applies a physical address concentratedly accessing the word line (WL1 of FIG. 2) of the DRAM 300-1 through the system bus 120.

The concentration access detector 210 of the memory controller 203 generates a concentration access detection signal (CADS). The address converter 270 receives the concentration access detection signal (CADS) and applies an address converting request signal to the DRAM controller 230.

The DRAM controller 230 swaps data stored in memory cells connected to the specific word line WL1 with data stored in memory cells connected to the word line WLn through the substitution buffer 280.

After the swapping operation, the DRAM controller 230 switches a row address of the specific word line WL1 with a row address of the word line WLn through the address converter 270. By an address remapping control of the DRAM controller 230, if a row address accessing the specific word line WL1 is applied, the word line WLn is instead accessed.

In the case that an access is concentrated on the specific word line WL1, memory cells connected to the word lines WL0 and WL2 adjacent to the specific word line WL1 are free from a spatial disturbance due to a coupling effect. Also, as an access concentration is solved, corruption of data of memory cells connected to an access concentrated word line is prevented or minimized.

Figure 7:
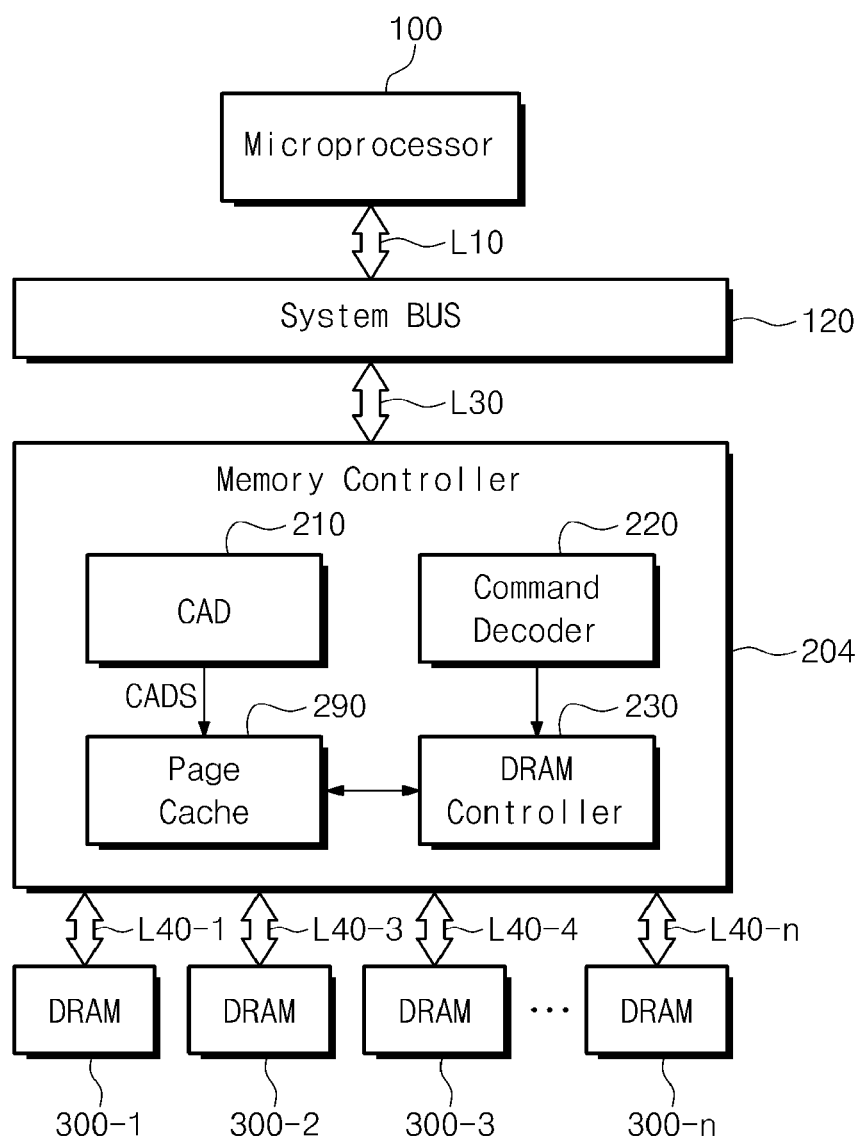
FIG. 7 is an exemplary detailed block diagram of some other embodiments in accordance with FIG. 1.

FIG. 7 is an exemplary detailed block diagram of some other embodiments in accordance with FIG. 1.

Referring to FIG. 7, a memory controller 204 may include the concentration access detector 210, the command decoder 220, the DRAM controller 230 and a page cache 290.

When the concentration access detection signal is generated, the memory controller 204 caches data stored in memory cells connected to the access concentrated specific word line WL1 of the DRAM 300-i in the page cache 290. And then, if a row address accessing the specific word line WL1 is received, the memory controller 204 makes the specific word line WL1 not accessed. Instead, the memory controller 204 may provide data stored in the page cache 290 to the processor that requested an access.

In FIG. 7, assume that the microprocessor 100 applies a physical address concentratedly accessing the word line (WL1 of FIG. 2) of the DRAM 300-1 through the system bus 120.

The concentration access detector 210 of the memory controller 204 generates a concentration access detection signal (CADS). The DRAM controller 230 reads data stored in memory cells connected to the specific word line WL1 to store the read data in the page cache 290. The page cache 290 is a register constituted by a flip-flop or a latch and may be comprised of volatile memory cells that do not need a refresh operation.

After a page caching operation is completed, the DRAM controller 230 makes the page cache 290 accessed if a row address of the specific word line WL1 is applied. If data of the page cache 290 is renewed, renewed data may be periodically stored in the specific word line WL1 or another word line.

In the case that an access is concentrated on the specific word line WL1, memory cells connected to word lines WL0 and WL2 adjacent to the specific word line WL1 are completely free from spatial disturbance due to a coupling effect or become robust. Also, in memory cells connected to an access concentrated word line, corruption of cell data therein are prevented or minimized as a problem of an access concentration is solved.

Although a page cache is used in FIG. 7, a block cache or a bank cache may be used in other embodiments.

Figure 8:
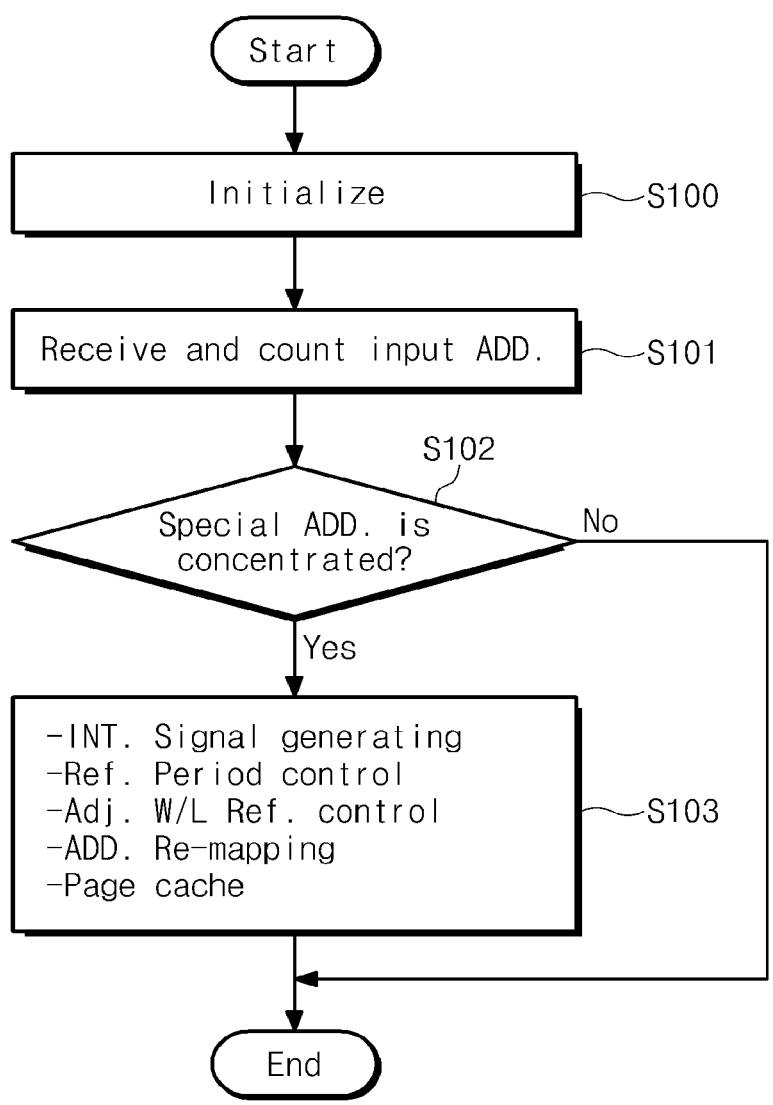
FIG. 8 is an exemplary operation control flow chart of a memory controller of FIG. 1.

FIG. 8 is an exemplary operation control flow chart of a memory controller of FIG. 1.

Referring to FIG. 8, in a step S100, the memory controller 200 performs initialization. When performing initialization, an internal register or flag is set in an initial state. In a step S101, an input address is received and counted. The input address may be a virtual address or a physical address applied from the processor. The memory controller 200 receives the virtual address or the physical address to generate a DRAM address.

In this case, the memory controller 200 checks whether a specific address is frequently received through a step S102 to detect a concentration access.

If a specific word line, a specific bit line or a specific memory block of volatile semiconductor memory such as DRAM is concentratedly accessed, corruption of memory cell data may be incurred. Word lines adjacent to the specific word line, bit lines adjacent to the specific bit line or memory blocks adjacent to the specific memory block may lose their cell data due to a concentration access. Various schemes which prevent or ease dissipation of cell data by solving or evading the address concentration are represented in a step S103.

When an access is concentrated on a specific memory area, the memory controller 200 can perform a control operation as described through FIGS. 3 through 7.

As described through FIG. 3, by generating an interruption, a processor changes an address assignment at an application program level.

As described through FIG. 4, when an auto refresh operation is performed on a concentratedly accessed word line or memory area, a refresh operation more frequently occurs.

As described through FIG. 5, a word line or memory area adjacent to a concentratedly accessed word line or memory area is refreshed.

As described through FIG. 6, a data swapping operation is performed through a substitution buffer and a concentratedly accessed address and an address not concentratedly accessed are remapped.

As described through FIG. 7, an access to a concentrated memory area is evaded by performing a data caching operation.

Figure 9:
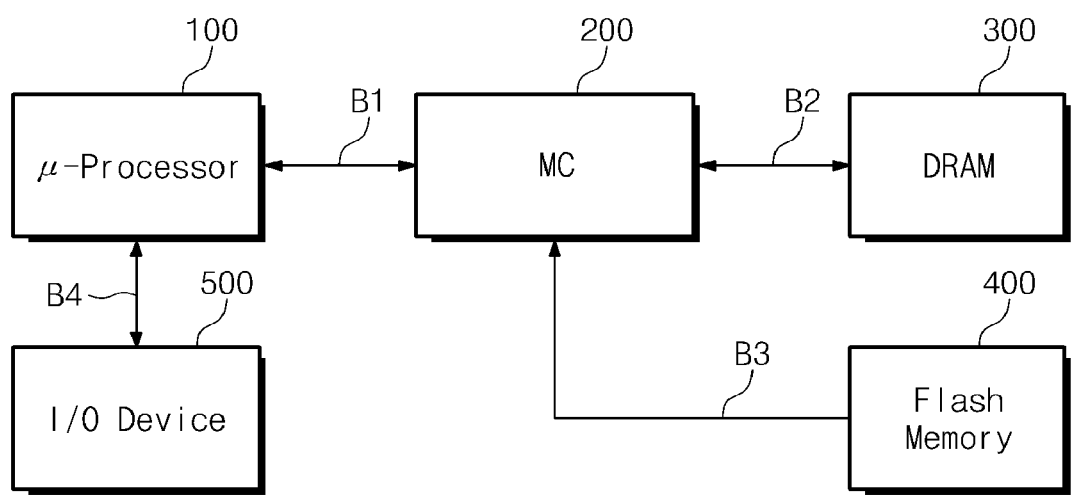
FIG. 9 is an exemplary illustrative block diagram of data storage device to which the present disclosure is applied.

FIG. 9 is an exemplary block diagram of data storage device to which the present disclosure is applied.

Referring to FIG. 9, a data storage device may include a microprocessor 100, an input/output device 500, a memory controller 200, a DRAM 300 and a flash memory 400.

The memory controller 200 connected to the microprocessor 100 through a bus B1 is connected to the DRAM 300 through a bus B2. The flash memory 400 which is a nonvolatile memory and is capable of flash erase is connected to the memory controller 200 through a bus B3. The input/output device 500 is connected to the microprocessor 100 through a bus B4.

The memory controller 200 can use the DRAM 300 as a user data buffer in a data storage device such as SSD.

In the case that a same request of the logic block address (LBA) continuously occurs from a host bus adaptor (HBA) of the microprocessor 100, the memory controller 200 can periodically invalidate or reallocate a memory area of the DRAM 300. In the case that the microprocessor 100 concentratedly accesses a specific word line of the DRAM 300 within an access operation cycle, the memory controller 200 prevents or minimizes corruption of cell data of victim memory cells of a memory area adjacent to a concentratedly accessed memory area by controlling a refresh period, performing an address remapping operation or performing a page caching operation.

In an application program level and a memory control level, corruption of cell data may not occur or may be eased. Thus, reliability of data storage device is improved and an operation performance is improved.

Figure 10:
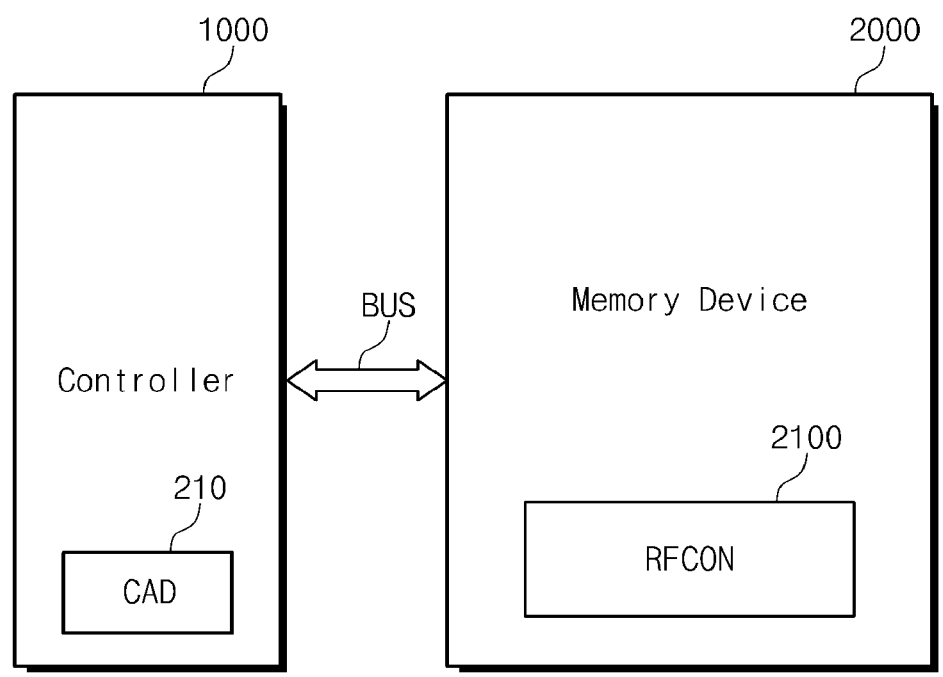
FIG. 10 is a block diagram illustrating an application example of the present disclosure applied to a memory system.

FIG. 10 is a block diagram illustrating an application example of the present disclosure applied to a memory system.

Referring to FIG. 10, a memory system includes a controller 1000 and a memory device 2000. The controller 1000 includes a concentration access detector (CAD) 210 in accordance with some embodiments. The memory device 2000 includes a refresh control circuit (RFCON) 2100 which is a refresh operation block. The controller 1000 can apply a command, an address and write data to the memory device 2000 through a bus BUS.

The concentration access detector (CAD) 210 of the controller 1000 checks whether an address (row address) for accessing a specific memory area (specific word line) among memory areas (word lines) of the memory device 2000 is concentratedly received and generates a concentration access detection signal if the address (row address) is concentratedly received.

The controller 1000 solves an address concentration with respect to the specific memory area (specific word line) when the concentration access detection signal is generated. Solution of the address concentration can be accomplished when the processor changes an address allocation using a software method by an interrupt request. Thus, corruption of data is prevented or minimized which memory cells of the specific memory area and/or memory cells of memory areas adjacent to the specific memory area hold.

As other methods for solution of address concentration, various schemes described through FIGS. 4 through 7 may be adopted.

By adopting those schemes, even when an access concentratedly occurs on a specific word line, it is difficult that cell data stored in memory cells connected to word lines adjacent to the specific word line is corrupted. For example, the memory cells connected to the word lines adjacent to the specific word line are free from spatial disturbance due to a coupling effect or become robust.

Thus, reliability of the memory system is improved and an operation performance is improved.

Figure 11:
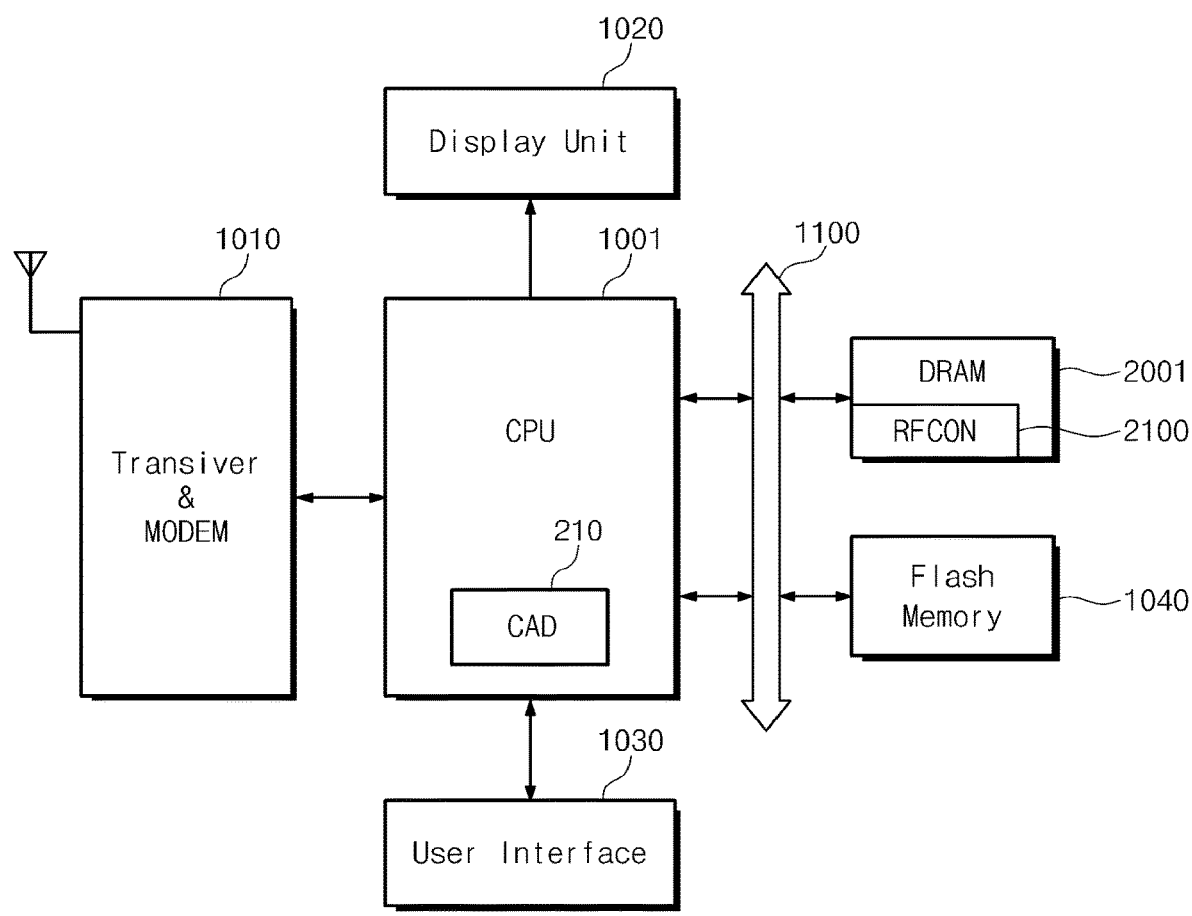
FIG. 11 is a block diagram illustrating an application example of the present disclosure applied to a mobile device.

FIG. 11 is a block diagram illustrating an application example of the present disclosure applied to a mobile device.

Referring to FIG. 11, a mobile device may include a transceiver and modem 1010, a CPU 1001, a DRAM 2001, a flash memory 1040, a display unit 1020 and a user interface 1030.

The CPU 1001, the DRAM 2001 and a flash memory 1040 may be manufactured or packaged in one chip in some cases. The DRAM 2001 and the flash memory 1040 may be embedded in the mobile device.

If the mobile device is a portable communication device, the transceiver and modem 1010 performs a transmission-reception function of communication data and a modulation-demodulation function of a communication data.

The CPU 1001 controls an overall operation of the mobile device according to a previously set program. The CPU 1001 may include a concentration address detector 210 in accordance with some embodiments.

The DRAM 2001 is connected to the CPU 1001 through a system bus 1100 and may function as a buffer memory or main memory of the CPU 1001. The DRAM 2001 may include a refresh control circuit (RFCON) 2100 to control a refresh operation of memory cells.

The CPU 1001 may apply a command, an address and write data to the DRAM 2001 through the system bus 1100.

The concentration access detector 210 of the CPU 1001 checks whether a row address for accessing a specific word line among word lines of the DRAM 2001 is concentratedly received and generates a concentration access detection signal if the row address is concentratedly received.

The CPU 1001, when the concentration access detection signal is generated, solves an address concentration on the specific word line using a software method or solves an address concentration on the specific word line by functionally controlling the DRAM 2001.

Thus, corruption of data of memory cells connected to the specific word line and/or memory cells connected to word lines adjacent to the specific word line is prevented, eased or minimized.

As methods for mitigating an address concentration, various schemes described through FIGS. 3 through 7 may be adopted.

By adoption of the schemes, even when an access concentratedly occurs on a specific word line, memory cells connected to word lines adjacent to the specific word line are free from spatial disturbance due to a coupling effect or become robust.

Thus, reliability of a mobile device such as a smart phone is improved and an operation performance is improved.

The flash memory 1040 may be a NOR-type flash memory or a NAND-type flash memory.

The display unit 1020 may have a touch screen as a device of a liquid crystal having a backlight, a liquid crystal having an LED light source or an OLED. The display unit 1020 functions as an output device representing an image of a character, a number or a picture, etc by a color.

The user interface 1030 may be an input device including a number key, a function key, etc. and performs a function of interfacing an electronic device and person.

The mobile device is described mainly with a mobile communication device but in some cases, may function as a smart card by adding or subtracting constituent elements.

The mobile device can connect a separate interface with an external communication device. The communication device may be a digital versatile disc (DVD) player, a computer, a set top box (STB), a game machine, a digital camcorder, etc.

Although not illustrated in the drawing, a set application chip, a camera image processor (CIS), a mobile DRAM, etc. may be further provided to the mobile device.

The DRAM chip 2001 or the flash memory chip 1040 may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In FIG. 11, a flash memory is adopted but various types of nonvolatile storages may be used.

The nonvolatile storage can store data having various types of data such as a text, a graphic, a software code, etc.

The nonvolatile storage may be embodied by an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

Figure 12:
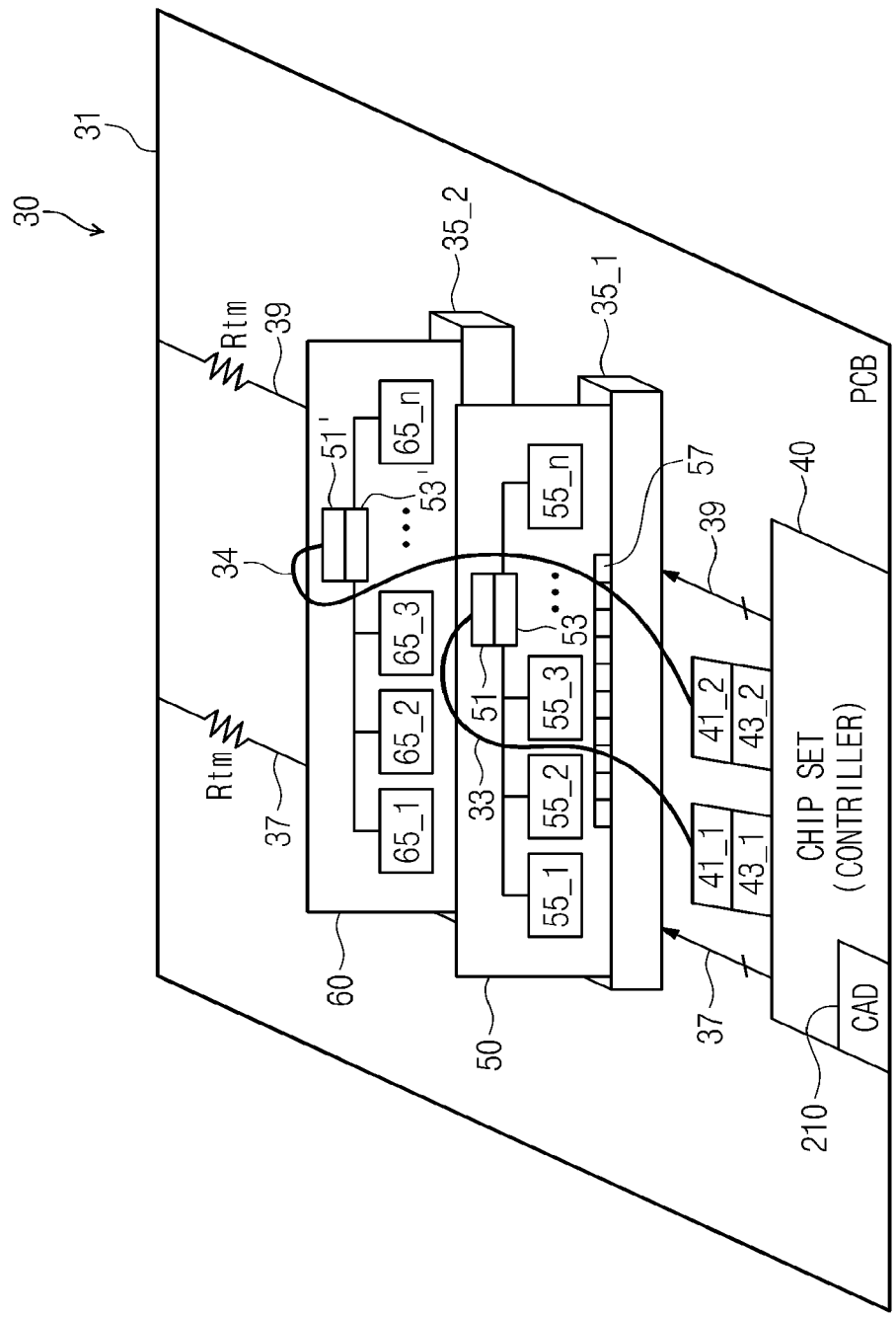
FIG. 12 is a block diagram illustrating an application example of the present disclosure applied to an optical I/O schema.

FIG. 12 is a block diagram illustrating an application example of the present disclosure applied to an optical I/O schema.

Referring to FIG. 12, a memory system 30 adopting a high speed optical I/O includes a chip set 40 as a controller and memory modules 50 and 60 which are mounted on a PCB substrate 31. The memory modules 50 and 60 are inserted into slots 35_1 and 35_2 installed on the PCB substrate 31 respectively. The memory modules 50 includes a connector 57, a DRAM memory chips 55_1 through 55_n, an optical I/O input part 51 and an optical I/O output part 53.

The optical I/O input part 51 may include a photoelectric conversion device (e.g., photodiode) for converting an optical signal being applied into an electrical signal. An electrical signal output from the photoelectric conversion device is received to the memory module 50. The optical I/O output part 53 may include an electrophotic conversion device (e.g., laser diode) for converting an electrical signal output from the memory module 50 into an optical signal. When necessary, the optical I/O output part 53 may further include an optical modulator for modulating a signal output from a light source.

An optical cable 33 is in charge of an optical communication between the optical I/O input part 51 of the memory module 50 and an optical transmission part 41_1 of the chipset 40. The optical communication may have a bandwidth of several tens of Giga bits per second. The memory module 50 can receive signals or data applied from signal lines 37 and 39 of the chipset 40 through the connector 57 and can perform a high speed data communication with the chipset 40 through the optical cable 33. Resistors (Rtm) installed in lines 37 and 39 not described are termination resistors.

Since the chipset 40 has the concentration access detector 210 (CAD) even in case of the memory system 30 adopting a high speed optical I/O, the solution scheme of concentration access in accordance with the disclosed embodiments may be applied in various forms. in the case that the DRAM memory chips 55_1 through 55_n of the memory modules 50 and 60 are accessed by a memory page unit, a column unit or a bank unit, the concentration access detector 210 monitors an access concentration.

In the case that the concentration access detector 210 monitors a concentration of memory page unit, it cumulatively compares a row address and if the number of same row addresses is more than the frequency of setting-up accesses, the concentration access detector 210 can generate the concentration access detection signal.

The concentration access detector 210 cumulatively compares the row address within the previously set unit time to generate the concentration access detection signal.

In the case that the memory system of FIG. 12 is a SSD, the DRAM memory chips 55_1 through 55_n may be used as a user data buffer.

In the case that a request of the same logical block address (LBA) continuously occurs, the chipset 40 periodically invalidates or reallocates an internal buffer area of the DRAM memory chips. Thus, an address concentration on a specific WL or memory area of the DRAM memory chips is evaded and thereby performance and reliability of SSD are improved.

Figure 13:
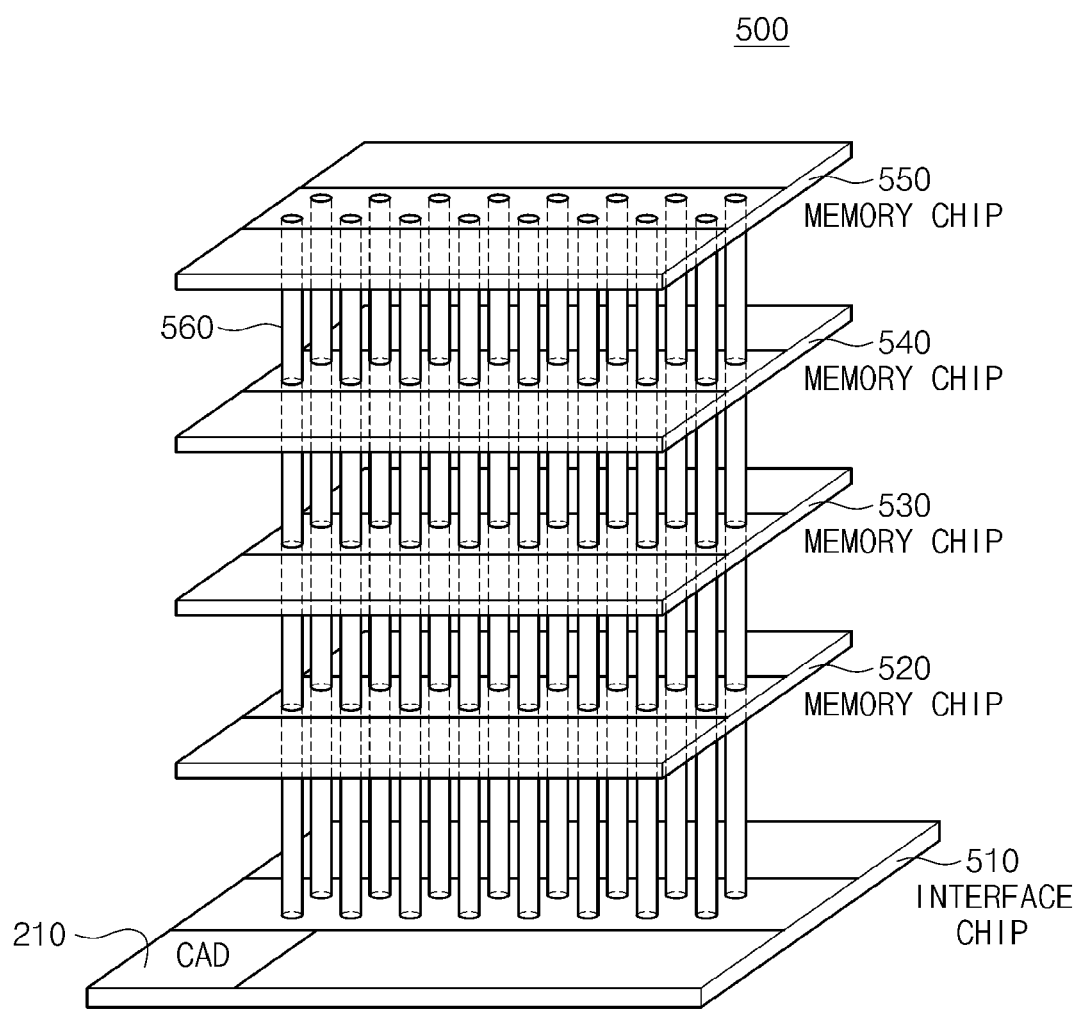
FIG. 13 is a block diagram illustrating an application example of the present disclosure applied to a through silicon via (TSV).

FIG. 13 is a block diagram illustrating an application example of the present disclosure applied to a through silicon via (TSV).

Referring to a structure of laminated memory device 500 of FIG. 13, a plurality of memory chips 520, 530, 540 and 550 is vertically stacked on a top surface of an interface chip 510. A plurality of through silicon vias 560 is formed while penetrating the memory chips 520, 530, 540 and 550. The memory device 500 of three dimensional stack package type vertically stacking the plurality of memory chips using the TSV technology has a structure which is advantageous in high speed, low power consumption and miniaturization while storing huge amount of data. In case of the laminated memory device of FIG. 13, since the interface chip 510 can include the concentration access detector 210, prevention or mitigation of corruption of data of the memory chips 520, 530, 540 and 550 can be effectively performed.

Figure 14:
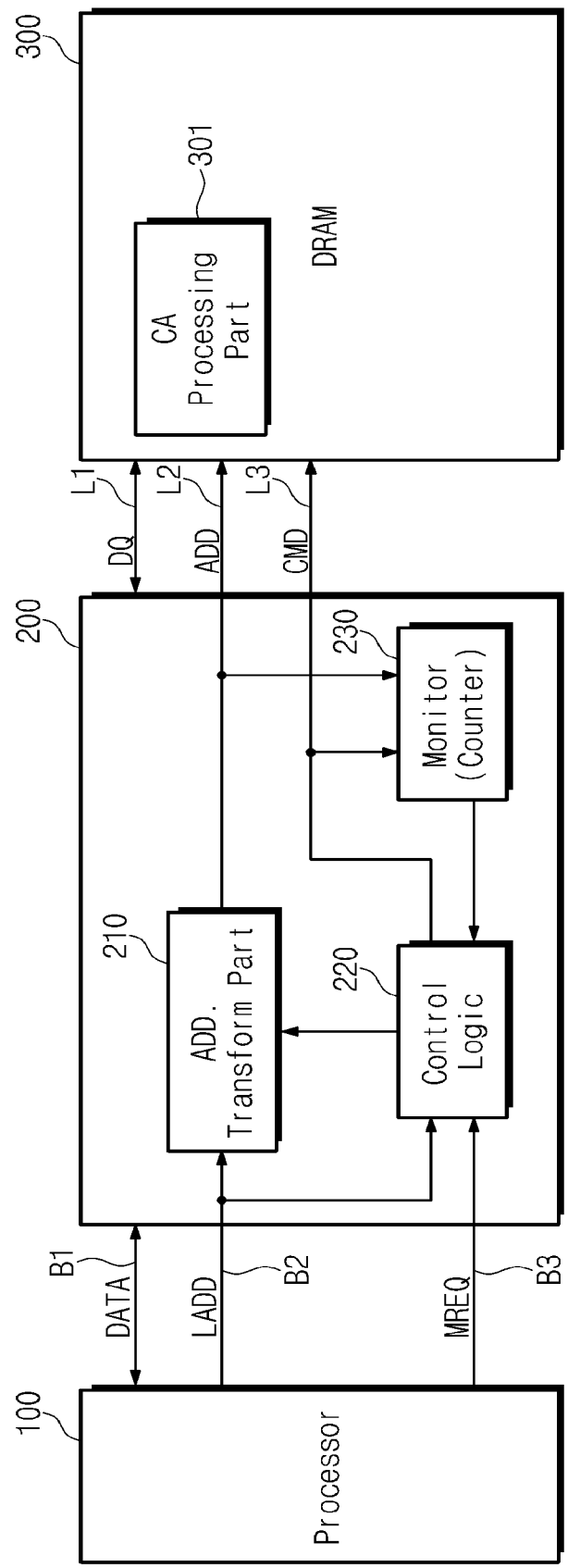
FIG. 14 is a constituent block diagram of a memory system in accordance with some embodiments.

FIG. 14 is a constituent block diagram of a memory system in accordance with some other embodiments.

Referring to FIG. 14, a memory system connected to a processor 100 may include a memory controller 200 and a semiconductor memory device 300.

The memory controller 200 may include an address transform part 210, a monitor 230 and control logic 220.

The address transform part 210 receives a logic address LADD being applied through a bus B2 to transform the logic address LADD into a physical address ADD for an access of the semiconductor memory device 300.

The monitor 230 receives the physical address ADD and a command signal CMD to monitor whether a specific word line of the semiconductor memory device 300 is concentratedly accessed. Using an internal counter, the monitor 230 can count whether an address concentration occurs more than N times (N is a natural number of 100,000 or more) during a set refresh period of the semiconductor memory device. If a row address selecting a specific word line occurs more than the specific number of times, an address concentration is detected by the monitor 230.

The control logic 220 receives a memory request signal MREQ being applied through a bus B3 and if an output result of the monitor 230 is expressed to be a concentration address, the control logic 220 outputs a concentration address detection signal (a concentration address detection signal disclosed herein, maybe referred to as a concentration detection signal or a concentration access detection signal) to a line L3. Accordingly, memory cells connected to word lines adjacent to the specific word line of the semiconductor memory device 300 are less stressed and disturbed.

Although the memory controller 200 is connected to the processor 100 through buses B1, B2 and B3 in the drawing, the memory controller 200 may be embedded in the processor 100.

The semiconductor memory device 300 may be a volatile semiconductor memory device such as a dynamic random access memory (DRAM).

The DRAM 300 includes the semiconductor memory cell array (320 of FIG. 2) and a concentration address processing part 301 which refreshes word lines adjacent to the specific word line in response to a concentration address detection signal being applied when an address accessing a specific word line of the semiconductor memory cell array 320 concentratedly occurs.

A refresh operation of a DRAM may be performed by changing a row address strobe (RASB) signal from logic 'high' to logic 'low' to apply it to the DRAM, and then driving a bit line sense amplifier sensing data of memory cell after activating a word line corresponding to a row address to be refreshed.

A refresh standard of DRAM is 16 ms/1024 cycle at 4 Mega. It is recommended that a refresh interval of 15.6 µs be maintained. In the memory controller 200, a refresh command is applied to the DRAM 300 over a period of 15.6 µs. Refresh time is determined by the total number of rows and the number of refresh cycles of the DRAM. In case of 4096 refresh cycles, refresh time becomes 64 ms by multiplying 15.6 µs by 4096.

In a refresh operation, when a refresh enable signal has a high level according to the refresh control signal RC, corresponding word lines are activated and a bit line sensing is performed. When the refresh enable signal has a low level, corresponding word lines are disabled and a bit line precharge is performed.

In case of setting the monitor 230 monitoring an address being concentrated on the DRAM 300, an area penalty and a performance penalty may occur. Thus, in some other embodiments, the monitor 230 is set inside or outside the memory controller 200 and the DRAM 300 receives a concentration address detection signal in a command form.

If a specific address is repeated more than the previously set number of times (e.g., 100,000), an address concentration is detected by a monitoring operation of the monitor 230.

When detecting an address concentration, various concentration address caring methods improving a data retention characteristic of memory cells connected to adjacent word lines can be done.

First, there is a method of making refresh periods of memory cells connected to word lines adjacent to an access concentrated word line or memory cells connected to bit lines adjacent to an access concentrated bit line shorter than the set refresh period.

Second, there is a method of performing refreshes of memory cells connected to word lines adjacent to an access concentrated word line or memory cells connected to bit lines adjacent to an access concentrated bit line when the access concentrated word line or the access concentrated bit line is selected.

Third, there is an address remapping method that data of memory cells connected to an access concentrated word line or data of memory cells connected to an access concentrated bit line is copied to memory cells connected to another word line or bit line, and then the copied data is accessed after a concentration access occurs more than the previously set number of times.

Fourth, there is a data cashing method that data of memory cells connected to an access concentrated word line or data of memory cells connected to an access concentrated bit line is transmitted to different types of memory cells (e.g., SRAM) different from the memory cells constituting the semiconductor memory, and then the data transmitted to the different types of memory cells is accessed after a concentration access occurs more than the previously set number of times.

In some other embodiments, the second method that a concentration address detection signal is provided to the DRAM 300 as a mode register set command when an access concentration occurs and the DRAM 300 internally strengthens a refresh of sacrificial memory cells will be mainly described.

Figure 15:
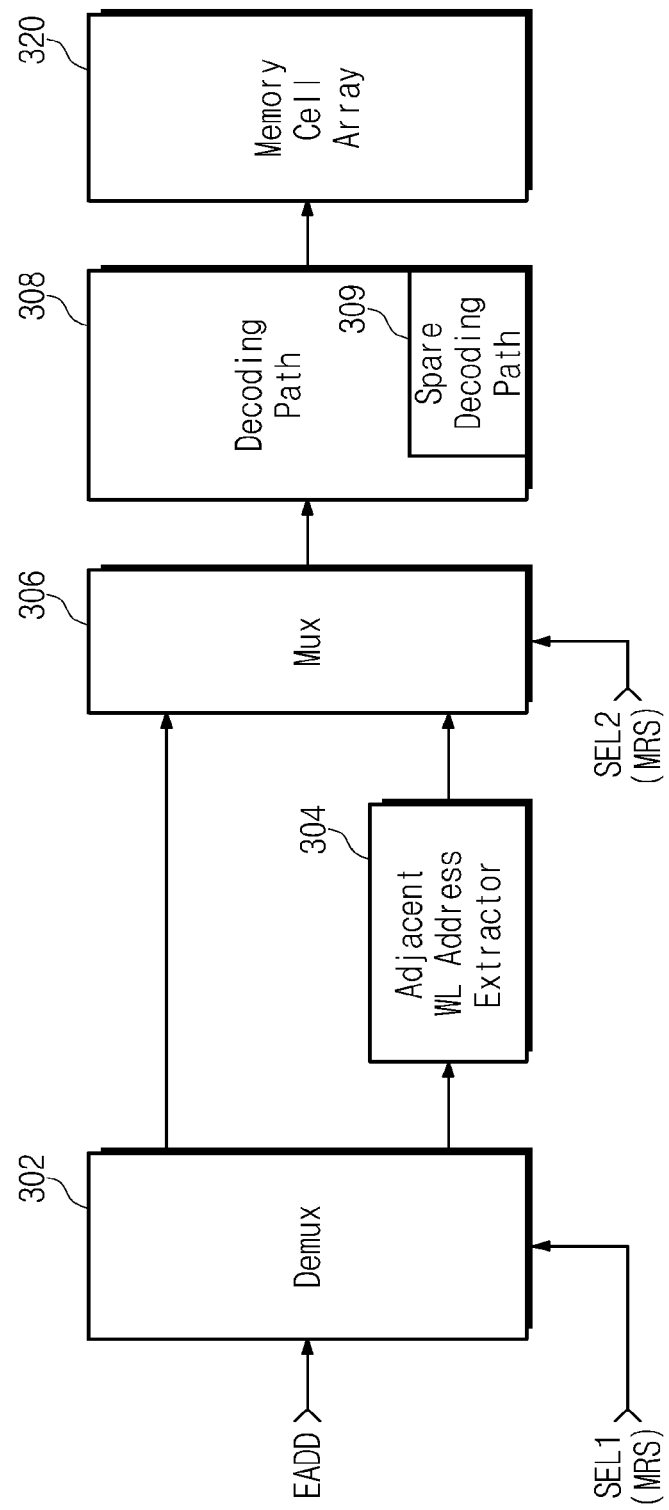
FIG. 15 is an exemplary illustrative block diagram of a concentration address processing part of FIG. 14.

FIG. 15 is an exemplary illustrative block diagram of a concentration address processing part of FIG. 14.

Referring to FIG. 15, the concentration address processing part 301 may include a demultiplexer 302, an adjacent row address extractor 304 and a multiplexer 306.

The demultiplexer 302 demultiplexs a concentration row address EADD according to a control signal SEL1.

The adjacent row address extractor 304 extracts adjacent row addresses from the concentration row address output from the demultiplexer 302.

The multiplexer 306 selects and outputs adjacent row addresses output from the adjacent row address extractor 304 according to a selection control signal SEL2.

A decoding path 308 including a spare decoding path 309 decodes the adjacent row addresses to apply a word line enable signal to the memory cell array 320.

The concentration address processing part 301 illustrated in FIG. 15 may be embodied in the refresh controller 370 illustrated in FIG. 2. The decoding path 308 may correspond to the row decoder 310 and the decoder 340.

Figures 16, 17:
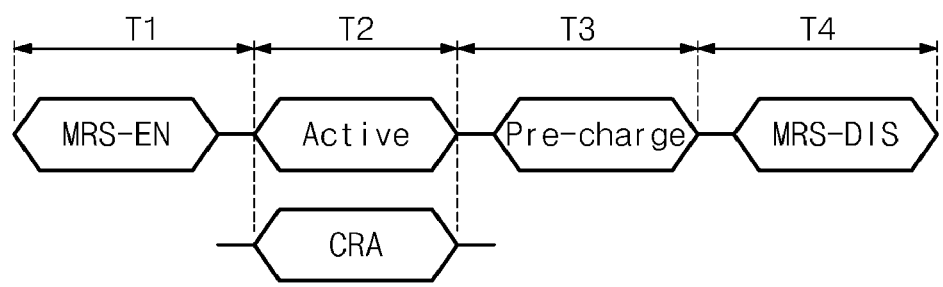
FIG. 16 is an exemplary table illustrating transmission forms of a concentration address detection signal being provided by a memory controller of FIG. 14.
FIG. 17 is an illustrative drawing illustrating transmission timing of the concentration address detection signal in accordance with FIG. 16.

FIG. 16 is an exemplary table illustrating transmission forms of a concentration address detection signal being provided by a memory controller of FIG. 14.

Referring to FIG. 16, when the control logic 220 of the memory controller 200 generates a concentration address detection signal, various examples of transmitting the concentration address detection signal to the DRAM 300 are shown.

A first case, like a reference numeral 4a, is to inform the DRAM 300 of a concentration address using a multipurpose register (MPR) write function. In the case that the DRAM 300 obeys a DDR 4 specification, when a concentration address detection signal is generated, the memory controller 200 can directly write a concentration address in the multipurpose register of the DRAM 300. In this case, the concentration address may be stored in the multipurpose register of the DRAM 300 through a data line L1. If the concentration address is written in the multipurpose register, the DRAM 300 may perform one of various operations improving a data retention characteristic of sacrificial memory cells according to a given protocol.

A second case of a method of transmitting a concentration address detection signal, like a reference numeral 4*b*, is to apply a mode register set (MRS) signal and a concentration row address to the DRAM 300.

A third case, like a reference numeral 4*c*, is to apply a mode register set (MRS) signal and a concentration row address of more than two times to the DRAM 300.

A fourth case, like a reference numeral 4*d*, is to apply a mode register set (MRS) signal and adjacent row addresses of the concentration row address to the DRAM 300.

FIG. 17 is an illustrative drawing illustrating transmission timing of the concentration address detection signal in accordance with FIG. 16.

Referring to FIG. 17, transmission timing according to the second case is illustrated. A MRS enable signal is applied through a line L3 of FIG. 14 in a first time section T1. When an active command signal is applied in a second time section T2, a concentration row address CRA is applied through a line L2 of FIG. 14. A precharge command is applied in a third time section T3 and a MRS disable signal is applied through the line L3 of FIG. 14 in a fourth time section T4.

If the DRAM 300 receives the command signals and the concentration row address, the concentration address processing part 301 can extract adjacent word line address and can refresh word lines adjacent to the access concentrated word line. In the case that the adjacent word lines are repaired word lines, the spare decoding path 309 of FIG. 15 is activated instead of a normal decoding path, so that redundancy word lines are activated instead of failed word lines.

Figure 18:
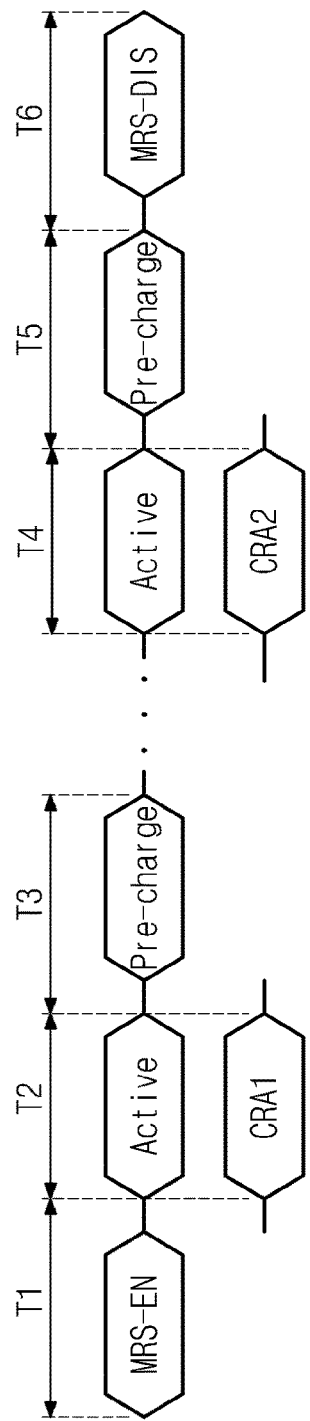
FIG. 18 is another illustrative drawing illustrating transmission timing of the concentration address detection signal in accordance with FIG. 16.

FIG. 18 is another illustrative drawing illustrating transmission timing of the concentration address detection signal in accordance with FIG. 16.

Referring to FIG. 18, transmission timing according to the third case is illustrated. A MRS enable signal is applied through the line L3 of FIG. 14 in the first time section T1. When an active command signal is applied in the second time section T2, a concentration row address CRA1 is applied through the line L2 of FIG. 14. A precharge command is applied in the third time section T3. After the predetermined elapsed time, when an active command signal is applied in the fourth time section T4, a concentration row address CRA2 is applied again through the lien L2 of FIG. 14. A precharge command is applied in a fifth time section T5 and a MRS disable signal is applied through the line L3 of FIG. 14 in a sixth time section T6.

If the DRAM 300 receives the command signals and the concentration row address that is repeatedly applied, the concentration address processing part 301 of the DRAM 300 can extract an adjacent word line address and can refresh word lines adjacent to the access concentrated word line. In the case that the adjacent word lines are repaired word lines, the spare decoding path 309 of FIG. 15 is activated instead of a normal decoding path, so that redundancy word lines are activated instead of failed word lines.

Figure 19:
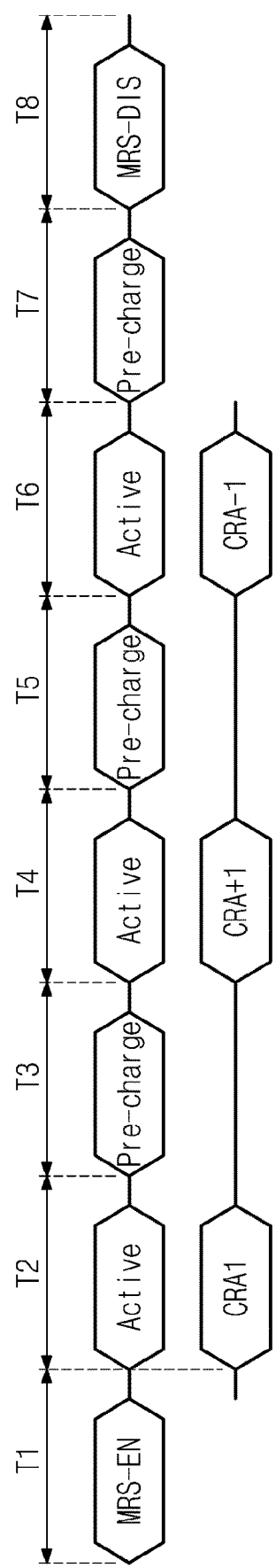
FIG. 19 is still another illustrative drawing illustrating transmission timing of the concentration address detection signal in accordance with FIG. 16.

FIG. 19 is still another illustrative drawing illustrating transmission timing of the concentration address detection signal in accordance with FIG. 16.

Referring to FIG. 19, transmission timing according to the fourth case is illustrated. A MRS enable signal is applied through the line L3 of FIG. 14 in the first time section T1. When an active command signal is applied in the second time section T2, a concentration row address CRA1 is applied through the line L2 of FIG. 14.

When an active command signal is applied in the fourth time section T4, a high rank adjacent address CRA+1 of the concentration row address is applied through the line L2 of FIG. 14. When an active command signal is applied in a sixth time section T6, a low rank adjacent address CRA−1 of the concentration row address is applied through the line L2 of FIG. 14.

And then, a precharge command is applied in a seventh time section T7 and a MRS disable signal is applied through the line L3 of FIG. 14 in an eighth time section T8.

If the DRAM 300 receives the command signal, the concentration row address and the adjacent row addresses, the concentration address processing part 30 of the DRAM 300 may be free from a burden of extracting adjacent word line addresses. In this case, it is necessary only to check whether adjacent word lines corresponding to the adjacent word line addresses are repaired or not and to refresh the corresponding word lines.

Figure 20:
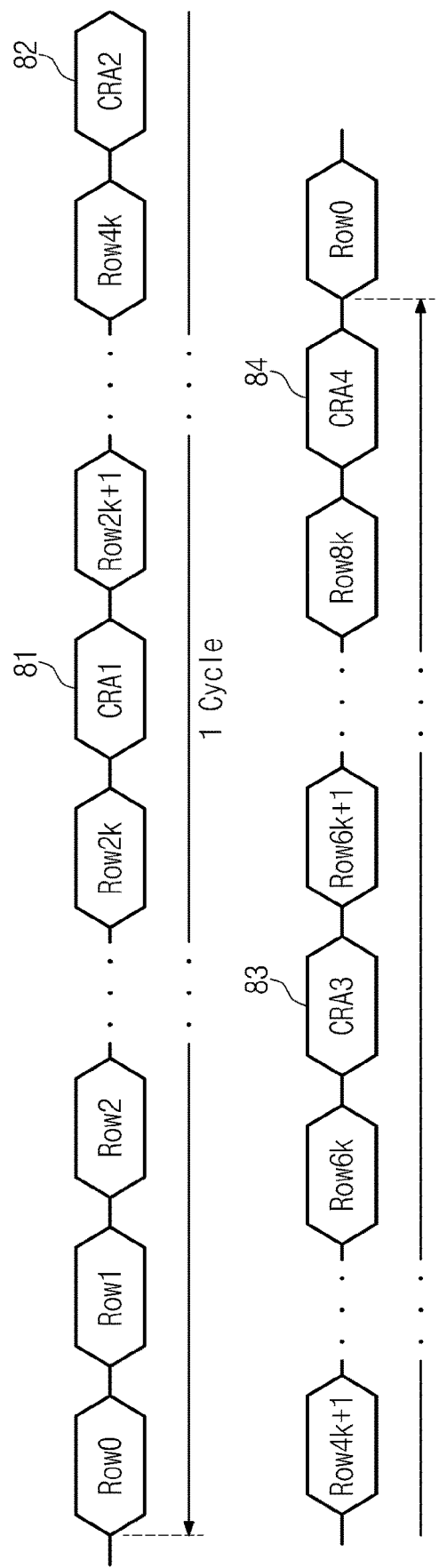
FIG. 20 is an illustrative drawing illustrating timing of a refresh operation performance in accordance with FIG. 15.

FIG. 20 is an illustrative drawing illustrating timing of a refresh operation performance in accordance with FIG. 15.

Referring to FIG. 20, if 1 refresh cycle refreshes 8 k word lines, a refresh operation is additionally performed on adjacent word lines at every 2 k. In FIG. 20, reference numerals 81,82,83 and 84 represent that a refresh operation is additionally performed on adjacent word lines at every 2 k. The number of times a refresh operation is performed on adjacent word lines becomes 5 which is the sum of 1 (the number of times of originally allocated refreshes) and 4 (the number of times of additional refreshes).

By performance of the refreshes, memory cells connected to word lines adjacent to an access concentrated word line or memory cells connected to bit lines adjacent to an access concentrated bit line are less stressed or disturbed when an address concentration occurs. Thus, when an access concentration occurs, cell data corruption of the semiconductor memory may be prevented or eased.

Figure 21:
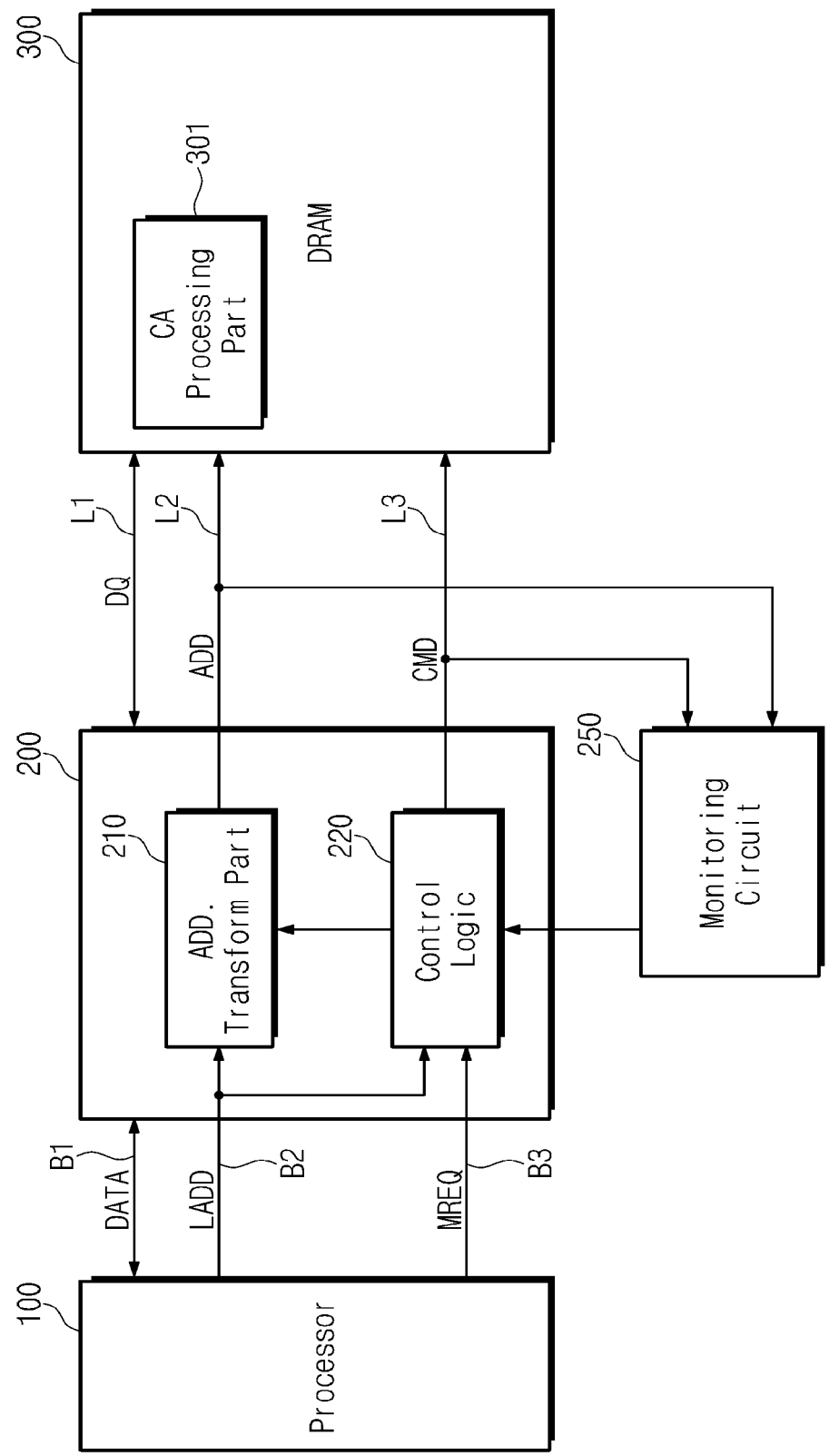
FIG. 21 is an exemplary constituent block diagram of a memory system in accordance with some embodiments.

FIG. 21 is an exemplary constituent block diagram of a memory system in accordance with some other embodiments.

Referring to FIG. 21, a monitoring circuit 250 is set up outside the memory controller 200.

Like the monitor 230 of FIG. 14, the monitoring circuit 250 receives a physical address and a command signal to monitor whether a specific word line of the semiconductor memory device is concentratedly accessed.

The memory system of FIG. 21 may be the same with that of FIG. 14 in a circuit operation or an overall operation of the system except that the monitoring circuit 250 is set up outside the memory controller 200.

The memory system of FIG. 21 has advantages of easing a hardware constitution burden of the memory controller 200 and selectively adopting an interlock with the monitoring circuit 250.

Figure 22:
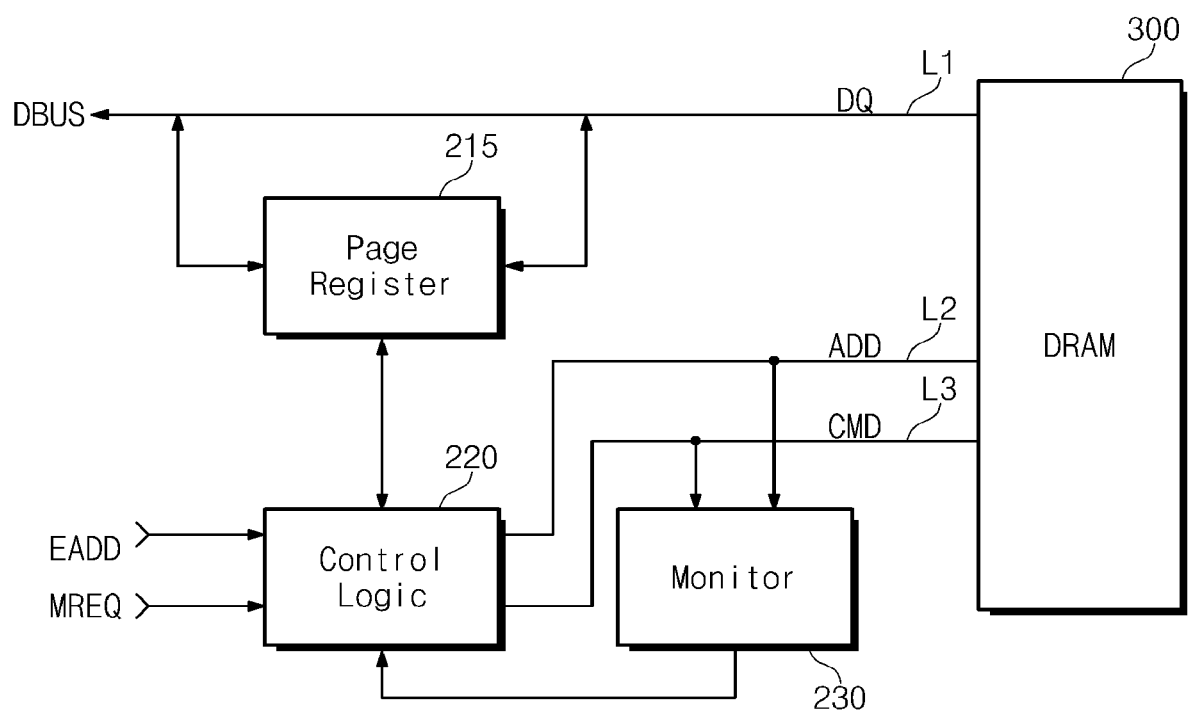
FIG. 22 is a constituent block diagram illustrating a modification example of a memory controller of FIG. 14.

FIG. 22 is a constituent block diagram illustrating a modification example of a memory controller of FIG. 14.

Referring to FIG. 22, in a memory controller 200 of a new constitution, the address transform part 210 of FIG. 14 is removed and a page register 215 is included.

The page register 215 is connected between a data bus DBUS and a DQ line L1. The page register 215 may include a cell array including a different type of memory cell (e.g., a SRAM cell having a flip-flop structure) different from a DRAM cell. The page register 215 may be a memory including nonvolatile memory cells.

In the case that an output result of the monitor 230 is expressed to be a concentration address, the control logic 220 applies a concentration address detection signal to the DRAM 300. In this case, the DRAM 300 outputs data of memory cells connected to an access concentrated word line to the DQ line L1. Data output to the DQ line L1 is copied to the page register 215.

After the data is stored in the page register 215, if an address for accessing the concentrated word line is applied, the control logic 220 outputs data stored in the page register 215 to the bus DBUS or store write data in the page register 215 while not activating the concentrated word line.

An access concentrated specific word line is not activated during set access prohibition time. Thus, memory cells connected to word lines adjacent to the specific word line is less stressed or disturbed.

After the access prohibition time has passed, data stored in the page register 215 is stored in memory cells connected to the access concentrated specific word line. In case of performing an address remapping, data stored in the page register 215 may be stored in memory cells connected to a different word line from the access concentrated specific word line.

In case of FIG. 22, memory cells connected to word lines adjacent to the access concentrated word line are cared by a data cache schema. Thus, a refresh strengthen method of controlling refreshes of memory cells connected to the adjacent word lines may be excluded.

Figure 23:
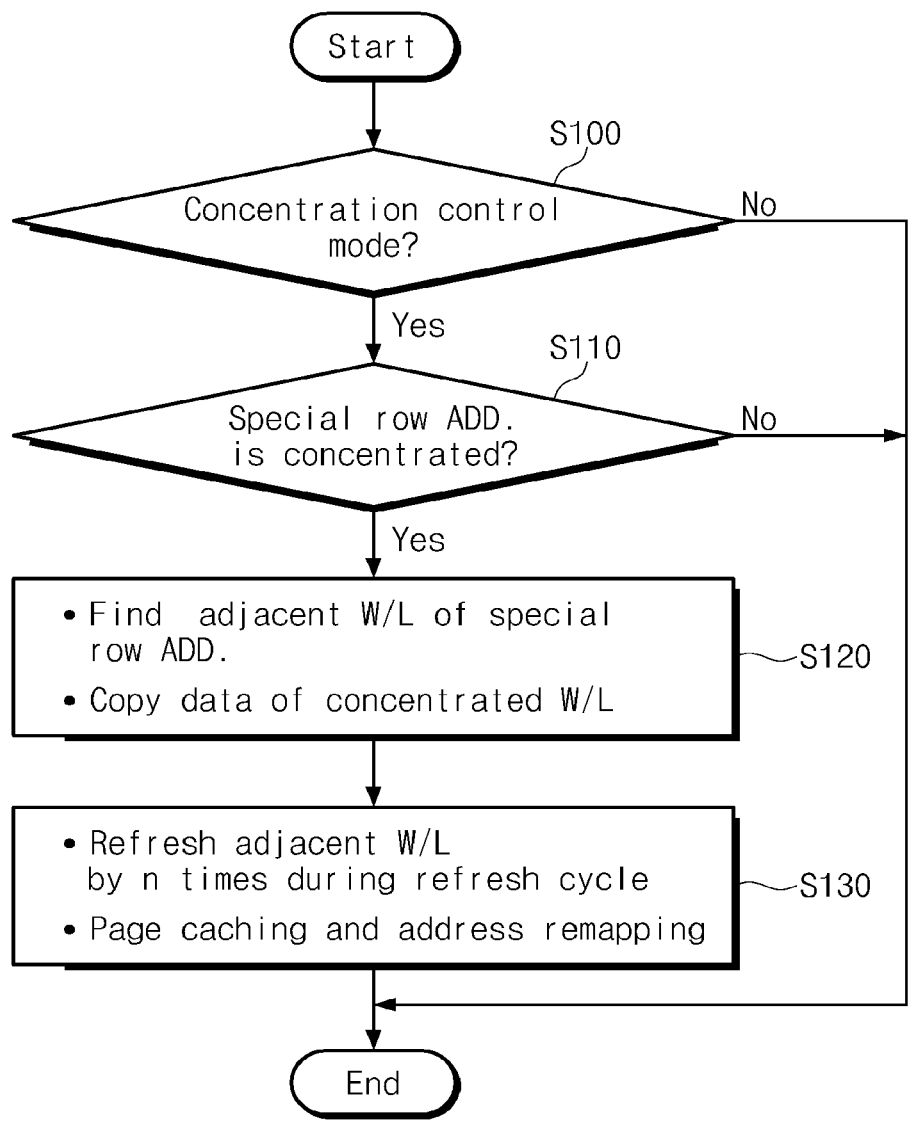
FIG. 23 is an exemplary operation control flow chart of a concentration address caring in accordance with FIG. 14.

FIG. 23 is an exemplary operation control flow chart of a concentration address caring in accordance with FIG. 14.

Referring to FIG. 23, in a step S100, it is checked whether a concentration control mode is executed or not. It may be determined by selection of a manufacturing maker or user whether a concentration control mode is executed or not. A user may set an execution of the concentration control mode to manage life of performance of a SSD or semiconductor memory.

The concentration control mode may automatically set as system use time passes or when the number of times of power on/off reaches a specific number.

In a step S110, the monitor 230 of FIG. 14 checks whether a specific row address is concentrated. In the case that an address repeatedly selecting any word line of the semiconductor memory device 300 is checked more than the previously set number of times by the monitor 230, the control logic 220 generates a concentration address detection signal.

In a step S120, an operation of finding word lines adjacent to the specific row address is executed. The operation of finding adjacent word lines may be performed by the adjacent word line address extractor 304 of FIG. 15. The control logic 220 may directly find adjacent addresses.

Instead of the operation of finding the adjacent word lines, when the concentration address detection signal is generated, the control logic 220 may copy data from memory cells connected to a concentrated word line to store the copied data in the page register 215 of FIG. 22.

In a step S130, in the case that the adjacent word lines are founded, in the DRAM 300, the adjacent word lines may be refreshed the set number of times during a refresh cycle.

In the case that data is stored in the page register 215, a page caching and an address remapping may be performed as described above.

When an access is concentrated on a specific word line, by performing a page caching or a refresh strengthen operation, memory cells connected to word lines adjacent to the specific word line may be less stressed or disturbed, or may be free from a stress or a disturbance.

Referring back to FIG. 9, in the case that a request of the same logic block address LBA is continuously generated from a host bus adaptor HBA of the microprocessor 100, the memory controller 200 can invalidate or reallocate a memory area of the DRAM 300. In the case that the microprocessor 100 concentratedly accesses a specific word line of the DRAM 300, the memory controller generates a concentration address detection signal. Thus, by a page caching of data, an address remapping or a refresh operation execution in the DRAM 300, corruption of cell data of sacrificial cells connected to word lines adjacent to the word line which is concentratedly accessed may be prevented or minimized.

If corruption of cell data does not occur or is eased, reliability of the data storage device is improved and operation performance is improved.

Referring back to FIG. 10, the controller 1000 of the memory system may include the monitor 230 of FIG. 14 instead of the CAD 210. The memory device 2000 may include the concentration address processing part 301 of FIG. 14 instead of the RFCON.

The monitor 230 checks whether a row address for accessing a specific word line among word lines of the memory device 2000 is concentratedly received. If the row address is concentratedly received, the controller 1000 generates a concentration address detection signal to solve the problem of address concentration on the specific word line or refresh memory cells connected to word lines adjacent to the specific word line.

Thus, even in the case that an access to a specific word line concentratedly occurs, it is difficult that cell data stored in memory cells connected to the adjacent word lines is corrupted. For example, memory cells connected to the adjacent word lines are free from a spatial disturbance due to a coupling effect or are strengthened. Thus, reliability of the memory system is improved and operation performance thereof is improved.

Referring back to FIG. 11, the CPU 1001 may include the monitor 230 of FIG. 14 instead of the CAD 210.

The DRAM 2001 may include the concentration address processing part 301 to control a refresh operation with respect to sacrificial memory cells.

The monitor 230 of the CPU 1001 checks whether a row address for accessing a specific word line among word lines of the DRAM 2001 is concentratedly received to generate a concentration address detection signal when concentratedly receiving the row address.

As the concentration address detection signal of the CPU 1001 is generated, memory cells connected to memory cells adjacent to the specific word line are refreshed. The refresh operation may be performed more than twice during 1 refresh cycle.

Even when an address is concentrated, memory cells connected to the word lines adjacent to the word line concentratedly accessed are free from a spatial disturbance due to a coupling effect or are strengthened. Thus, reliability of mobile device such as a smart phone is improved and operation performance thereof is improved.

Referring back to FIG. 12, even in the case of the memory system 30 adopting an optical I/O structure, the chipset 40 may include the monitor 230 instead of the CAD 210. Thus, various types of concentration access caring scheme may be applied. In the case that the DRAM memory chips (55_1~55_n, 65_1~65_n) of the memory modules 50 and 60 are accessed by a memory page unit, a column unit or a bank unit, the monitor 230 monitors an address concentration.

In the case that the monitor 230 monitors a concentration of memory page unit, it cumulatively compares a row address and if the number of same row addresses is more than the set frequency of access, it may generate the concentration address detection signal.

The monitor 230 cumulatively compares the row address within the range of predetermined unit time to generate the concentration address detection signal.

In the case that a same request of the logic block address (LBA) continuously occurs from a host bus adaptor (HBA) of the microprocessor 100, the chipset 40 can periodically invalidate or reallocate an internal buffer area of the DRAM memory chips. Thus, an address concentration on a specific word line or a memory area of the DRAM memory chips is evaded and thereby performance and reliability of SSD are improved.

Referring back to FIG. 13, since even in the case of the laminated memory device, the interface chip 510 may include the concentration address processing part 301 instead of the CAD 210, when a concentration address processing operation is performed, corruption prevention or corruption ease of memory cell data with respect to DRAMs in the plurality of memory chips 520, 530, 540 and 550 may be effectively performed.

Referring back to FIG. 14, in the case that a specific normal word line is concentratedly accessed, the concentration address processing part 301 can easily find row addresses of normal word lines adjacent to the specific normal word line.

However, in the case that a normal word line is tested to be failed and is repaired by a spare word line, it is difficult to find row addresses of spare word lines physically adjacent to the spare word line. This is because when performing a repair, the failed normal word line is randomly or flexibly replaced with one of a plurality of spare word lines.

A location where a spare word line exists in a memory cell array is irrelevant to a row address being applied from the outside. Thus, it is difficult to obtain row addresses of word lines adjacent to a spare word line or row addresses of the spare word lines only by making use of a row address indicating a normal word line applied from the outside.

Thus, only if row addresses of word lines physically adjacent to a spare word line or row addresses of the spare word lines are accurately obtained, memory cells connected to the adjacent word lines or the spare word lines can be more frequently refreshed.

Figure 24:
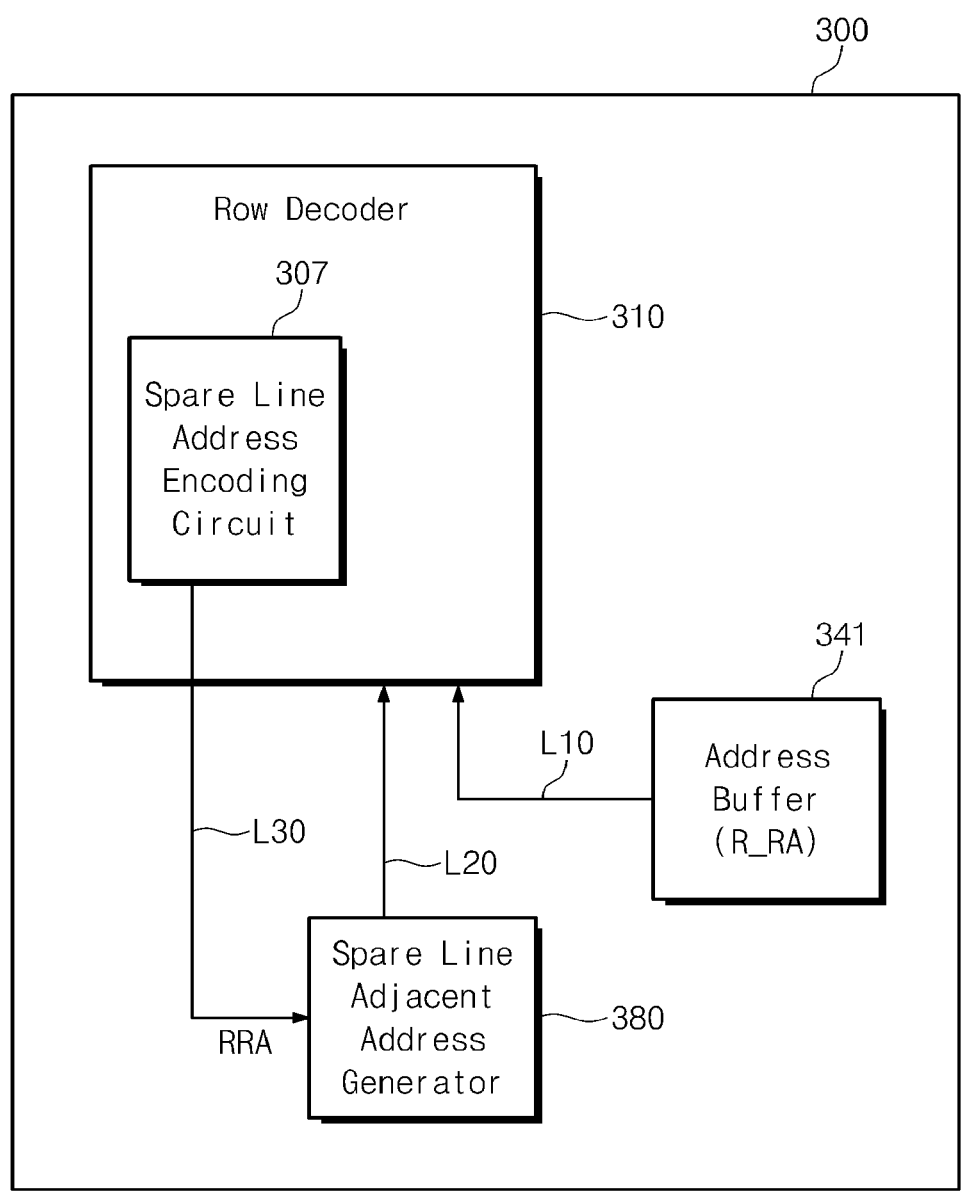
FIG. 24 is an exemplary schematic circuit block diagram of a DRAM of FIG. 14.

FIG. 24 is an exemplary schematic circuit block diagram of a DRAM of FIG. 14.

Referring to FIG. 24, a connection construction between a spare line address encoding circuit 307 and a spare line adjacent address generator 380 is illustrated. The spare line address encoding circuit 307 may be disposed in a row decoder 310. The row decoder 310 can receive a row address being applied from an address buffer 341 through a line L10.

The spare line address encoding circuit 307 encodes spare line enable signals being applied when a spare line replacing a normal line is activated to generate a spare line address RRA representing a physical location of the spare line being activated through a line L30.

The spare line adjacent address generator 380 receives the spare line address RRA to generate spare line adjacent addresses activating spare lines physically adjacent to the activated spare line through a line L20.

In the case that a spare word line replacing a normal word line is concentratedly enabled, the row decoder 310 receives the spare line adjacent addresses to frequently refresh a spare word line adjacent to the spare word line or memory cells connected to normal word lines.

Thus, when a spare word line is concentratedly accessed, the spare word lines adjacent to the spare word line or the memory cells connected to the normal word lines are effectively cared to ease stress or disturbance.

In some embodiments, the spare line may include a spare word line and in some cases, it may include a spare bit line.

Figure 25:
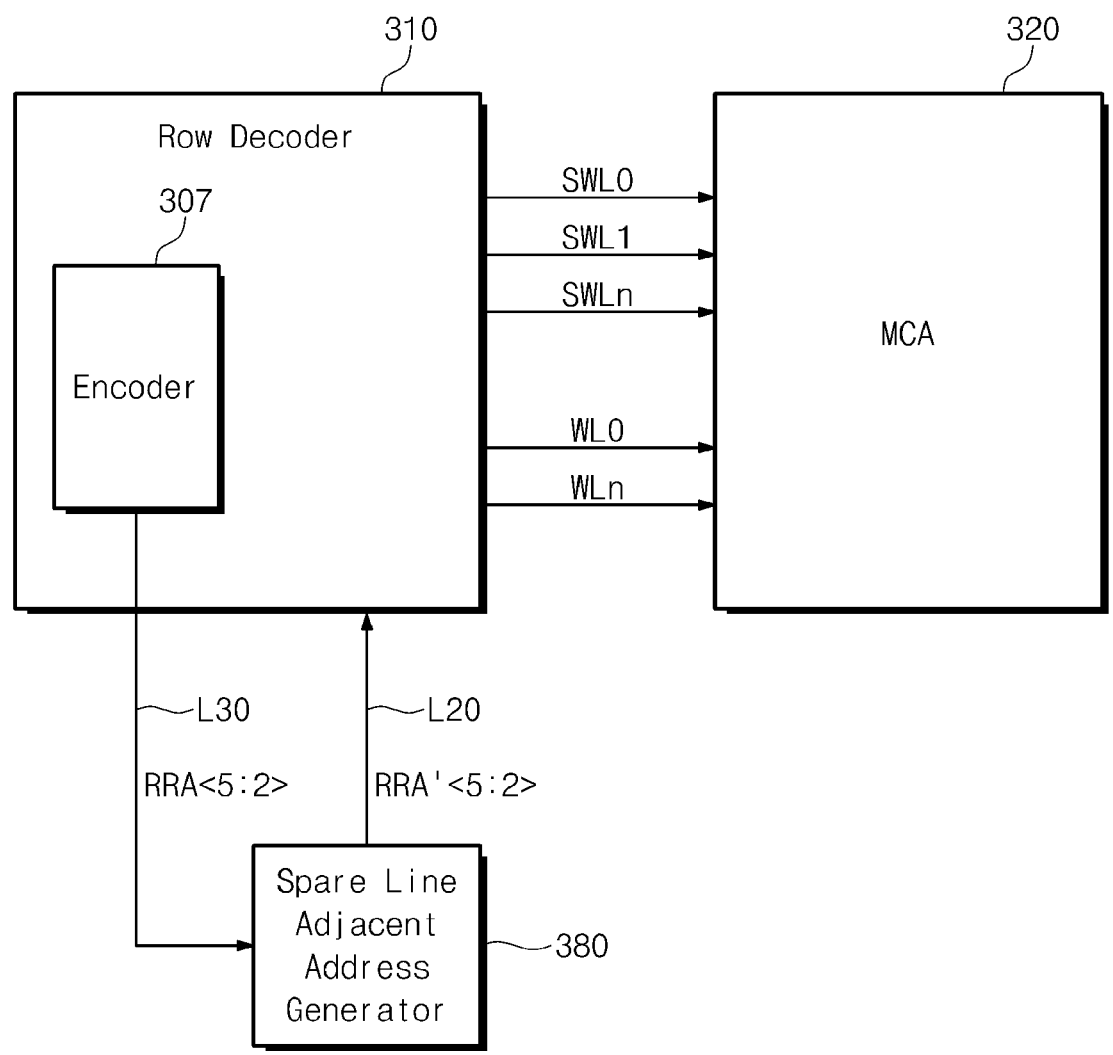
FIG. 25 is an illustrative drawing in accordance with FIG. 24.

FIG. 25 is an illustrative drawing in accordance with FIG. 24.

Referring to FIG. 25, a connection between the memory cell array 320 and the row decoder 310 is more specifically illustrated as compared with FIG. 24.

The memory cell array MCA 320 includes a normal memory cell array and a spare memory cell array. When a memory cell connected to a normal word line of the normal memory cell array is proved to be failed, the spare memory cell array replaces the failed memory cell with a spare memory cell connected to a spare word line.

Memory cells of the normal memory cell array are accessed in a read operation, a write operation and a refresh operation in response to activation of normal word lines WL0 and WLn.

Memory cells of the spare memory cell array are accessed in a read operation, a write operation and a refresh operation in response to activation of spare word lines SWL0, SWL1 and SWLn.

The memory cell array 320 includes a plurality of memory cells in a matrix form of row and column. Each memory cell includes one access transistor and one storage capacitor. A gate of the access transistor is connected to a corresponding word line. A drain of the access transistor is connected to a corresponding bit line. A plurality of memory cells connected to the same word line constitutes a memory page.

A state of data stored in a memory cell is determined by the quantity of charges stored in the storage capacitor. Since charges stored in the storage capacitor are leaked as time passes, a refresh operation restoring data before the state of the data is changed is needed in a DRAM.

The row decoder 310 decodes a row pre-decoding signal to activate a selected normal word line (e.g., WL0) or a selected spare word line (e.g., SWL1).

When the spare word line (e.g., SWL1) is activated, the encoder 307 encodes spare word line enable signals activating the spare word line to generate a spare word line address (RRA<5:2>) representing a physical location of the spare word line SWL1.

The spare line adjacent address generator 380 receives the spare word line address (RRA<5:2>) through the line L30 to generate spare word line adjacent addresses (RRA' <5:2>) activating spare word lines SWL0 and SWLn physically adjacent to the activated spare word line through the line L20.

Figure 26:
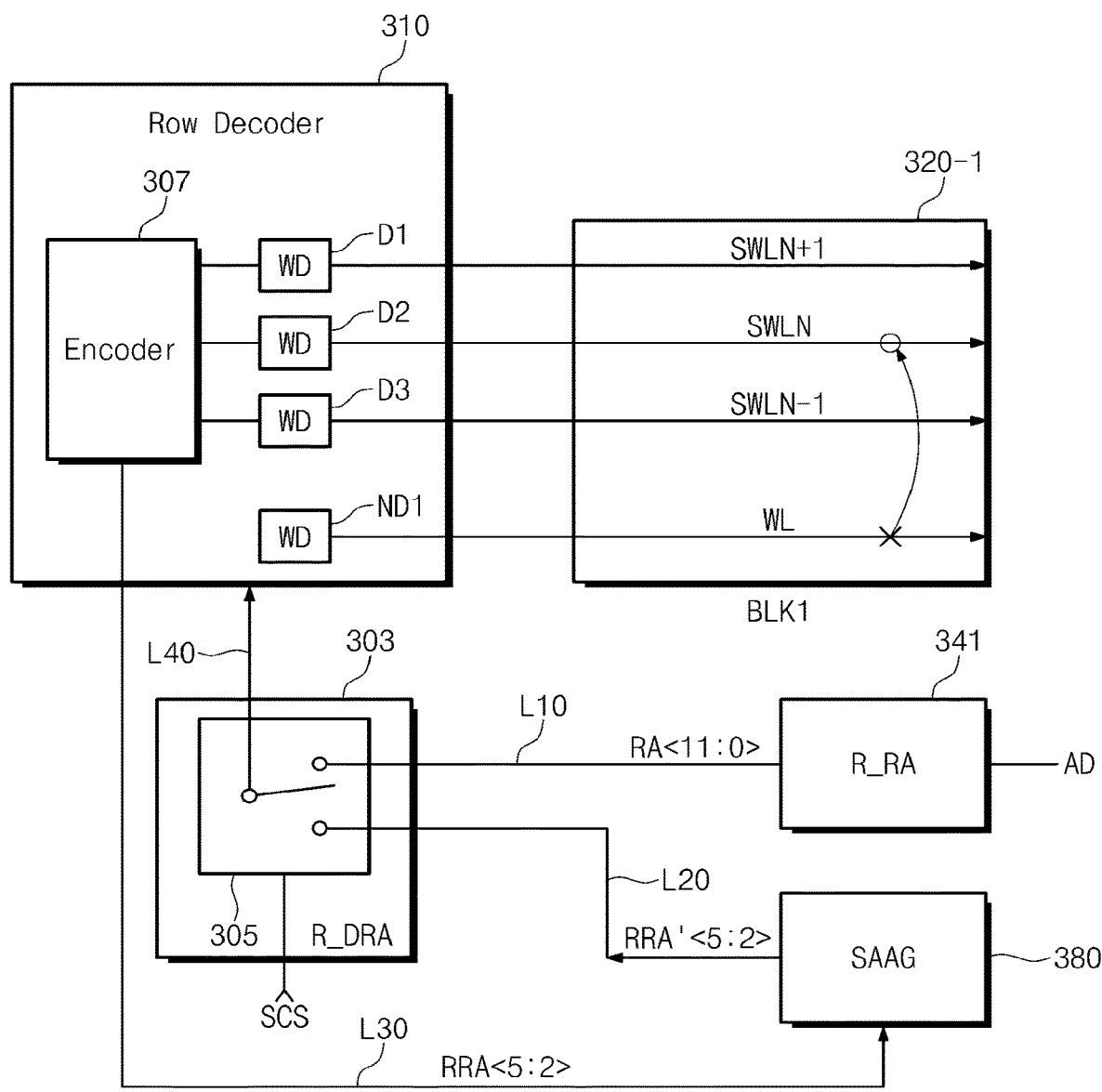
FIG. 26 is another illustrative drawing in accordance with FIG. 24.

FIG. 26 is another illustrative drawing in accordance with FIG. 24.

Referring to FIG. 26, unlike FIGS. 24 and 25, a pre-decoder 303 is installed between the row decoder 310 and the spare line adjacent address generator SAAG 380.

A memory block BLK1 is one block included in the memory cell array 320 of FIG. 25.

If addresses are received, the pre-decoder 303 performs a pre-decoding. The pre-decoder 303 includes a switch 305 for selectively receiving one of row addresses (RA<11:0>) being applied from the outside through the spare word line adjacent addresses (RRA' <5:2>) and an address input buffer 341. The switch 305 may be embodied by a multiplexer and responds to a select control signal SCS being applied when a specific spare line is concentratedly accessed.

An output line L40 of the pre-decoder 303 is connected to the row decoder 310.

An operation will be described with reference to FIG. 26.

A row address applied from the outside is applied to an address buffer R_RA 341 through an input buffer and an address flip flop. The address buffer 341 latches the row address AD in response to an internal signal generated by active command information. The latched row address (RA<11:0>) is applied to the pre-decoder 303 R_DRA 303 located at each memory bank through a global line L10. The pre-decoder R_DRA 303 pre-decodes the row address (RA<11:0>) being received to apply the pre-decoded row address (RA<11:0>) to a row decoder 310 through the line L40. The row decoder 310 decodes a pre-decoding row address being received through the line L40 to activate a selected word line.

If at least one of memory cells connected to a normal word line WL in a memory block 320-1 is proved to be failed by a test, a spare word line is designated by a redundancy circuit. Thus, if a row address selecting the normal word line WL is applied, a spare word line SWLN may be enabled instead. Memory cells are connected to the spare word line SWLN like memory cells connected to the normal word line.

In the case that the normal word line WL is concentratedly accessed, memory cells connected to spare word lines SWLN+1 and SWLN−1 adjacent to the spare word line SWLN are stressed or disturbed. Thus, since a retention characteristic of memory cells that are stressed or disturbed may be deteriorated, a caring of more frequently performing a refresh operation is required. In this case, only if a physical address of spare word line that replaced the normal word line is found, addresses for activating adjacent spare word lines can be accurately generated.

In the case that the spare word line SWLN is activated, a word line driver (WD:D2) of the row decoder 310 is enabled.

The encoder 307 connected to the word line driver (WD:D2) encodes spare word line enable signals activating the spare word line SWLN to generate a spare word line address (RRA<5:2>) representing a physical location of the spare word line SWLN.

The spare line adjacent address generator SAAG 380 receives the spare word line address (RRA<5:2>). The SAAG 380 generates spare word line adjacent addresses (RRA'<5:2>) for activating spare word lines SWLN+1 and SWLN−1 physically adjacent to the spare word line SWLN using the spare word line address. At least one of the spare word line adjacent addresses (RRA'<5:2>) is applied to the switch 305 of the pre-decoder 303 through the line L2.

In the case that the spare word line SWLN is concentratedly accessed, the select control signal SCS is activated by the mode register set (MRS) signal.

The switch 305 of the pre-decoder 303 is switched so that the spare word line adjacent address (RRA<5:2>) is applied to an input of the pre-decoder 303.

The pre-decoder 303 pre-decodes the spare word line adjacent addresses (RRA'<5:2>) to output it through the output line L40. For a refresh operation, the row decoder 310 decodes a pre-decoding row address of the output line L40 to sequentially or concurrently activate the spare word lines SWLN+1 and SWLN−1 physically adjacent to the spare word line SWLN.

In case of a refresh operation, when a refresh enable signal has a high level, corresponding word lines are activated and a bit line sensing is performed. When a refresh enable signal has a low level, corresponding word lines are disabled and a bit line precharge is performed.

The DRAM 300 performs an auto refresh operation when a memory access operation is performed and performs a self-refresh operation when a standby operation is performed.

The refresh enable signal may be generated by making use of command signals RASB, CASB, WEB and CSB and a mode register set signal.

As a design rule is decreased, a space between word lines SWLN and SWLN−1 to which memory cells of the memory cell array 320 are connected is increasingly decreased. Thus, data of memory cells may be corrupted by a spatial disturbance due to a coupling effect.

In the case that an address concentration occurs, memory cells connected to the spare word lines SWLN+1 and SWLN−1 physically adjacent to the spare word line SWLN are frequently refreshed in proportion to the number of times of access of the spare word line SWLN and thereby degradation of a retention characteristic thereof may be prevented or minimized.

Figure 27:
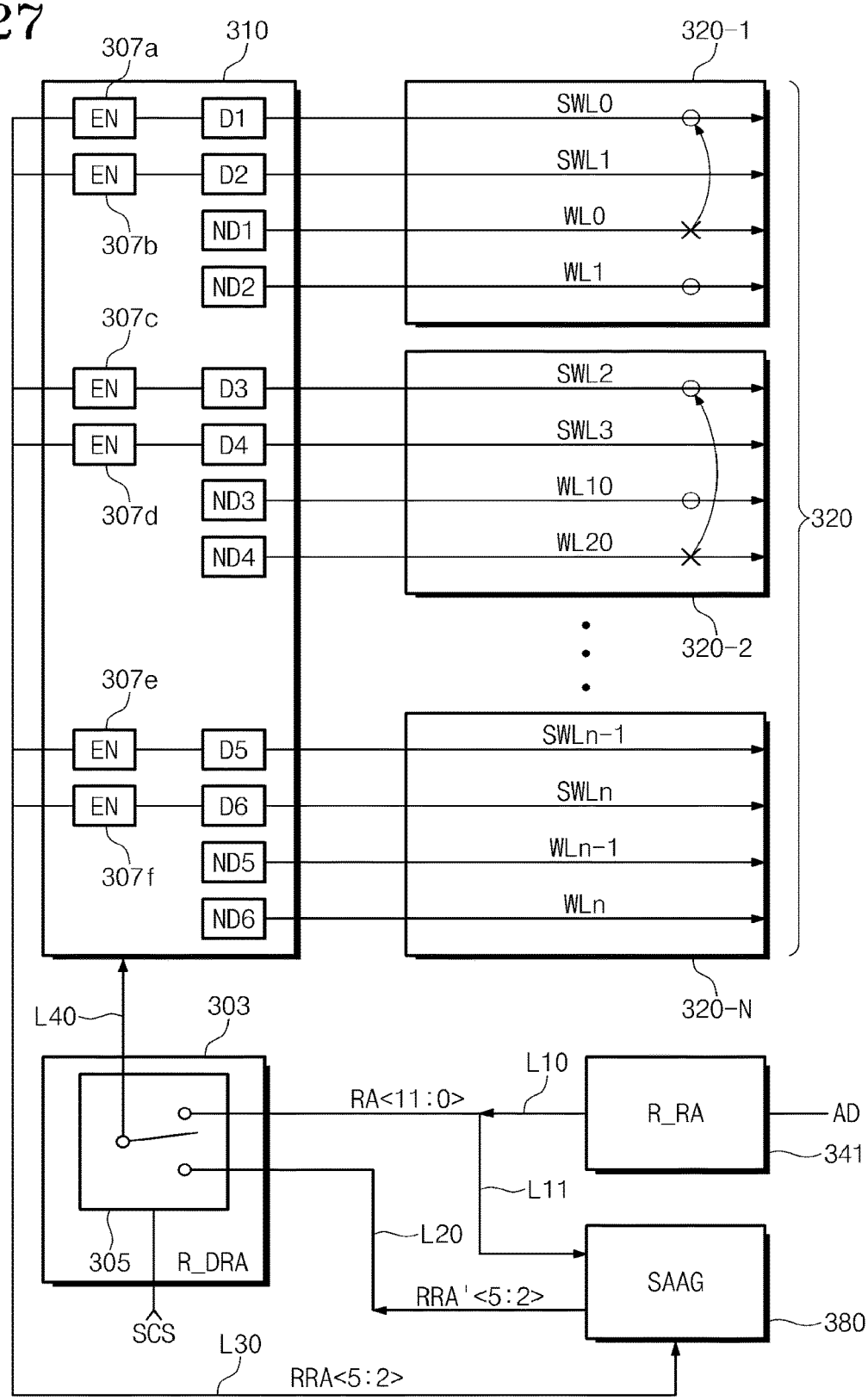
FIG. 27 is still another illustrative drawing in accordance with FIG. 24.

FIG. 27 is still another illustrative drawing in accordance with FIG. 24.

Referring to FIG. 27, encoders 307a~307f corresponding to spare word drivers respectively are installed in the row decoder 310.

In FIG. 27, a normal word line in a memory block 320-1 is repaired by a spare word line SWL0 and a normal word line WL20 in a memory block 320-2 is repaired by a spare word line SWL2.

In the case that the spare word line SWL2 in the second memory block 320-2 is activated, the corresponding encoder 307c generates the spare word line address (RRA<5:2>) representing a physical location of the spare word line SWL2 through the global line L30.

Since the global line L30 is shared by the encoders 307a~307f, an increase of chip size due to line arrangement may be minimized.

Even in case of being repaired, since an address of word lines physically adjacent to the spare word line can be generated, memory cells which are sacrificed by a concentration access can be cared.

Figure 28:
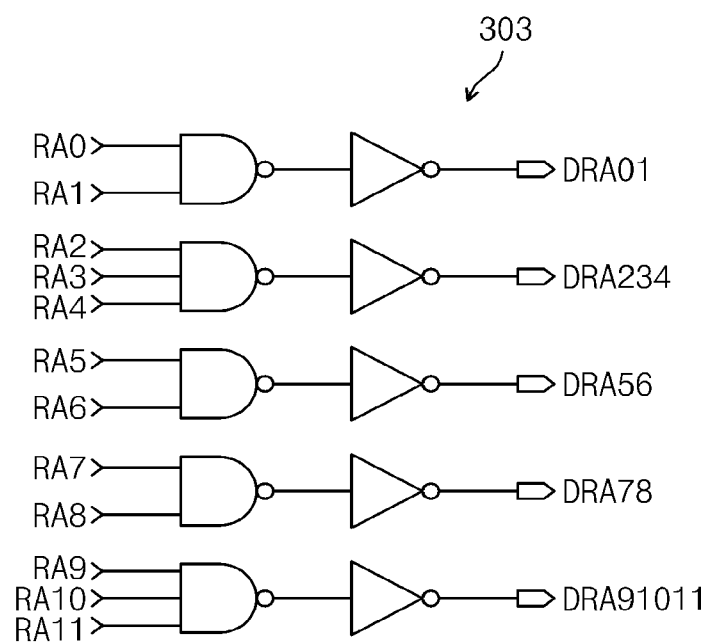
FIG. 28 is an illustrative drawing of a row pre-decoder which is related to FIG. 5.

FIG. 28 is an illustrative drawing of a row pre-decoder which is related to FIG. 5.

A row pre-decoder 303 performing a function of a row address pre-decoder may include a plurality of NAND gates and a plurality of inverters.

The row pre-decoder 303 performs a gate operation on row addresses RA0~RA11 to generate address pre-decoding signals DRA01~DRA91011.

The address pre-decoding signal DRA01 is a signal made by combining the row addresses RA0 and RA1. The address pre-decoding signal DRA234 is generated by combining the row addresses RA2, RA3 and RA4. The address pre-decoding signal DRA56 is made by combining the row addresses RA5 and RA6. The address pre-decoding signal DRA78 is generated by combining the row addresses RA7 and RA8. The address pre-decoding signal DRA91011 is a signal made by combining the row addresses RA9, RA10 and RA11.

The row pre-decoder 303 performs a gate operation on spare word line adjacent addresses RRA'2~RRA'5 to generate address pre-decoding signals RDRA'2~RDRA'5.

Figure 29:
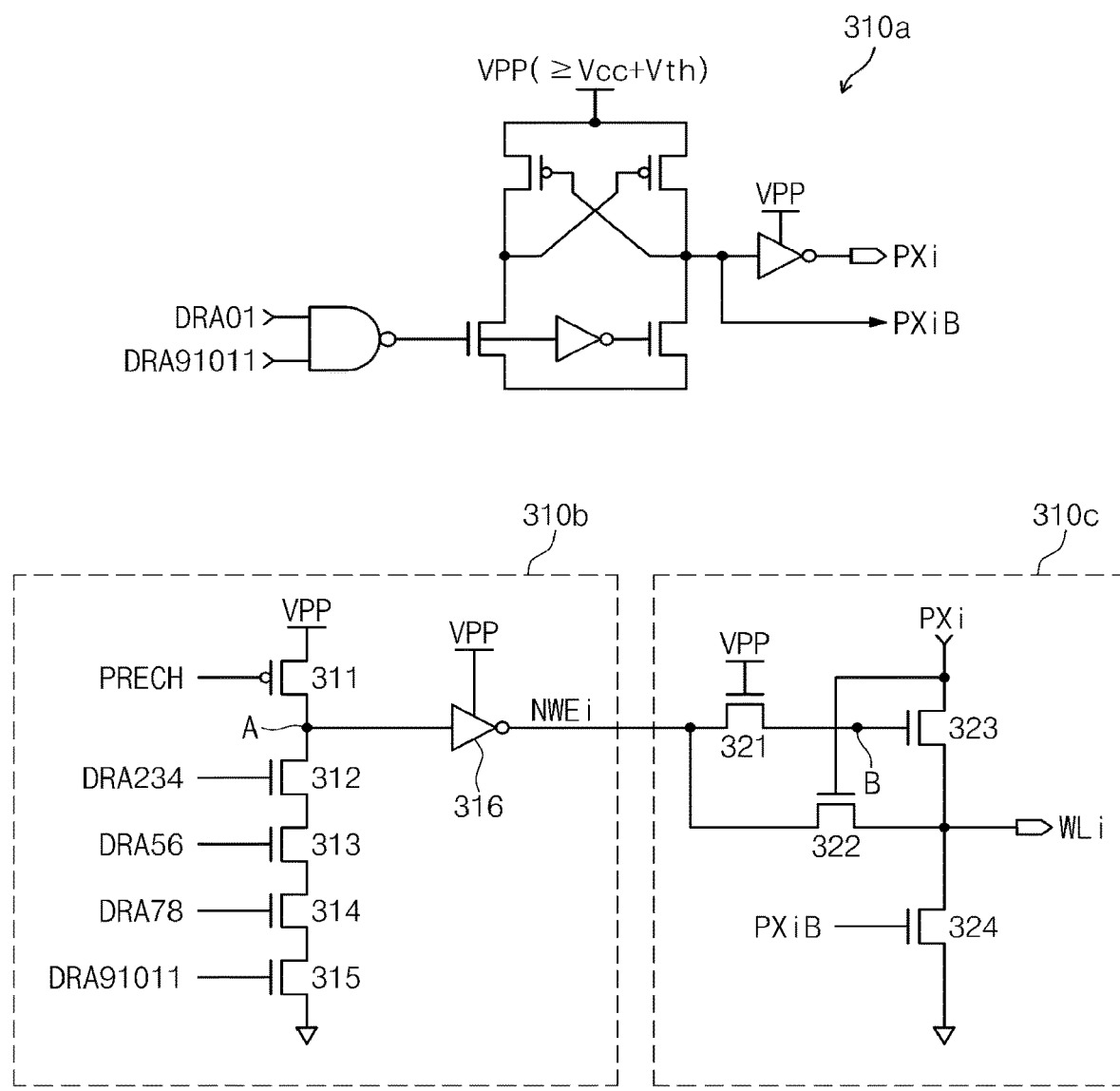
FIG. 29 is an exemplary drawing of a row decoder of FIG. 24.

FIG. 29 is an exemplary drawing of a row decoder of FIG. 24.

The row decoder 310 includes a sub word line decoder 310a and a word line driver 310b and 310c.

The sub word line decoder 310*a* generates sub word line signals PXi and PXiB by combining the address pre-decoding signals DAR01 and DRA91011. Since the sub word line decoder 310*a* is driven by a boosted voltage Vpp, voltage levels of the sub word line signals PXi and PXiB are the boosted voltage Vpp higher than a power supply voltage Vcc.

The word line driver includes a main decoder 310*b* and a driver 310*c*. The main decoder 310*b* includes a PMOS transistor 311 which responds to a precharge signal PRECH. NMOS transistors 312, 313, 314 and 315 serially connected to one another which respond to the address decoding signals DRA234, DRA56, DRA78 and DRA91011 respectively and an inverter 316 inverting a voltage level of a node A between the PMOS transistor 311 and the NMOS transistor 312. An output of the inverter 316 becomes a normal word line enable signal NWEi.

The driver 310*c* includes an NMOS transistor 321 transmitting the normal word line enable signal NWEi to a node B in response to the boosted voltage Vpp, an NMOS transistor 322 transmitting the normal word line enable signal NWEi to a word line WLi in response to a sub word line signal PXi, an NMOS transistor 323 transmitting the sub word line voltage PXi to the word line WLi in response to a voltage of a node B and an NMOS transistor 324 discharging the word line WLi to a ground voltage in response to a complementary sub word line signal PXiB.

Pre-decoded address signals DRAij are received at every activation section of row active command to generate the sub word line signal PXi and the normal word line enable signal NWEi (i is a natural number of two or more). The driver 310*c* receives the normal word line enable signal NWEi and the sub word line signal PXi to activate the selected word line WLi.

Figure 30:
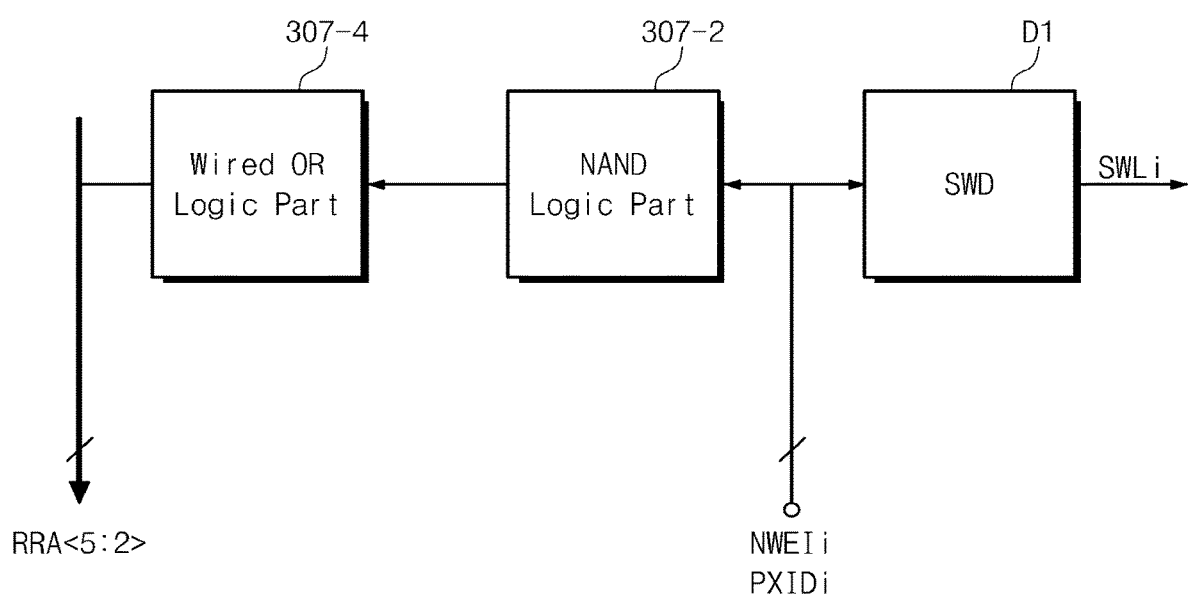
FIG. 30 is an illustrative drawing illustrating realization of an encoder of FIG. 25.

The encoder 307 is omitted in the row decoder 310 of FIG. 29 but it is illustrated in FIG. 30.

FIG. 30 is an illustrative drawing illustrating realization of an encoder of FIG. 25.

Referring to FIG. 30, the encoder 307 includes a NAND logic part 307-2 connected to a word line driver D1 and a wired OR logic part 307-4 performing an OR operation on an output of the NAND logic part 307-2.

The NAND logic part 307-2 performs an encoding operation by performing a NAND gating operation on spare line enable signals generated by the normal word line enable signal NWEi and the sub word line signal PXIDi.

An encoding operation of the encoder 307 is illustrated in FIG. 31.

FIG. 31 is an illustrative drawing of an encoding output of the encoder of FIG. 25.

In an encoding table of FIG. 31, 16 spare word lines are in one memory block. When a spare word line SWL0 replacing a normal word line is activated, a corresponding encoder encodes spare line enable signals enabling the spare word line SWL0 to output a spare word line address as '0000'. When a spare word line SWL2 replacing any normal word line is activated, a corresponding encoder encodes spare line enable signals enabling the spare word line SWL2 to output a spare word line address as '0010'. 1 is a value of RRA<3>.

Figure 32:
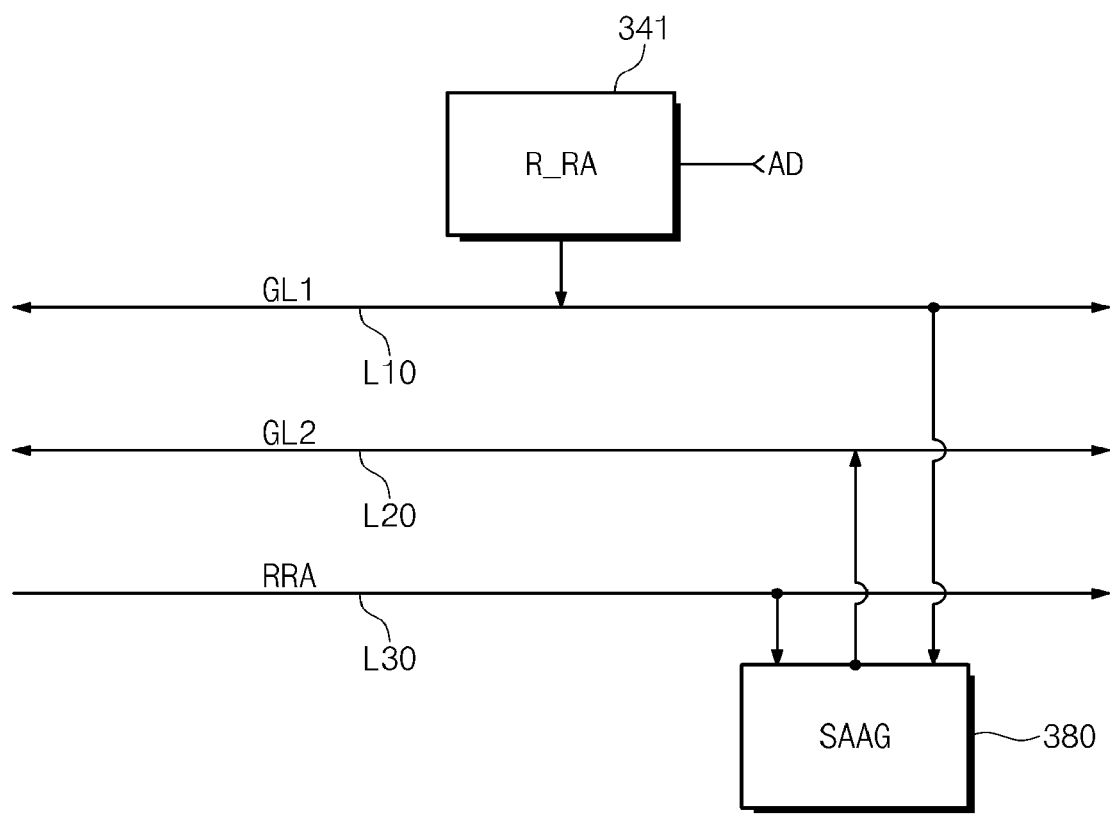
FIG. 32 is an illustrative drawing illustrating a global arrangement of signal lines of FIG. 24.

FIG. 32 is an illustrative drawing illustrating a global arrangement of signal lines of FIG. 24.

Referring to FIG. 32, a signal line L1 connected to an address buffer 341 may be arranged as a global line GL 1.

A signal line L2 may be arranged as a global line GL2.

A signal line L30 connected to the spare line adjacent address generator 380 may be arranged as a global line RRA.

Thus, an increase of chip size due to a line arrangement may be minimized.

In some embodiments, when an access is concentrated, a concentration address detection signal is provided to the DRAM 300 as a mode register set signal and the DRAM 300 internally generates adjacent addresses to strengthen a refresh operation with respect to sacrificial memory cells.

Referring back to FIG. 9, since the DRAM 300 includes the spare line address encoding circuit 307 and the spare line adjacent address generator 380 illustrated in FIG. 24, even when a spare word line is concentratedly activated, the DRAM 300 accurately generates addresses of spare word lines physically adjacent to the spare word line being activated. A data retention characteristic may be strengthened by more frequently refreshing memory cells connected to the adjacent spare word lines. Thus, product competitiveness of data storage device becomes high.

Referring back to FIG. 10, the memory device 2000 may become the DRAM 300 of FIG. 24. The DRAM 300 may include the encoder 307 disposed in the row decoder and the spare line adjacent address generator 380 illustrated in FIG. 25. Even in the case that a spare word line is concentratedly activated, addresses of spare word lines physically adjacent to the spare word line being activated are accurately generated. A data retention characteristic is strengthened by more frequently refreshing memory cells connected to the adjacent spare word lines. Thus, reliability and operation performance of the memory system are improved.

Referring back to FIG. 11, since the DRAM 2001 includes the spare line address encoding circuit 307 and the spare line adjacent address generator 380 illustrated in FIG. 24, even when a spare word line is concentratedly activated, the DRAM 2001 accurately generates addresses of spare word lines physically adjacent to the spare word line being activated. A data retention characteristic may be strengthened by more frequently refreshing memory cells connected to the adjacent spare word lines. Thus, product competitiveness of mobile device becomes high.

Referring back to FIG. 12, since even in case of the memory system 30 adopting an optical I/O structure, the DRAM memory chips 55_1~55_*n* includes the spare line address encoding circuit 307 and the spare line adjacent address generator 380 illustrated in FIG. 24, even when a spare word line is concentratedly activated, spare word lines physically adjacent to the spare word line being activated may enabled when a refresh operation is performed.

Thus, a data retention characteristic of memory cells connected to the adjacent spare word lines is strengthened.

Refereeing back to FIG. 13, even in the case of the laminated memory device, .DRAMs in the plurality of memory chips 520, 530, 540 and 550 have a spare line adjacent address generation function to strengthen a data retention characteristic of memory cells connected to adjacent spare lines of a spare line. Thus, operation reliability and product competitiveness of the laminated memory device become high.

The aforementioned descriptions are only illustrative embodiments and adjacent address generation method that can prevent or ease corruption of cell data connected to the adjacent spare lines due to an address concentration of the spare line may be variously changed.

In connection with a case that a word line scramble function is applied and a case that a word line scramble function is not applied, an illustration of method of finding row addresses of adjacent normal word lines will be described.

Referring back to FIG. 14, the concentration address processing part 301 refreshing word liens adjacent to a specific word line in response to a concentration address detection signal is included.

In the case that a specific normal word line is concentratedly accessed, a functional circuit finding row addresses of normal word lines adjacent to the specific normal word line is needed inside the DRAM 300.

However, it is not easy to accurately find row addresses of the word lines adjacent to the access concentrated word line. In the case that a contact is designed to be shared to effectively realize a memory core layout, the order of a physical row address may be different from the order of a row address being applied from the outside. This is called a word line scramble.

Only if row addresses of word lines physically adjacent to an access concentrated word line are accurately found considering a word line scramble policy set, stress or disturbance from which corresponding memory cells will suffer can be cared.

Figure 33:
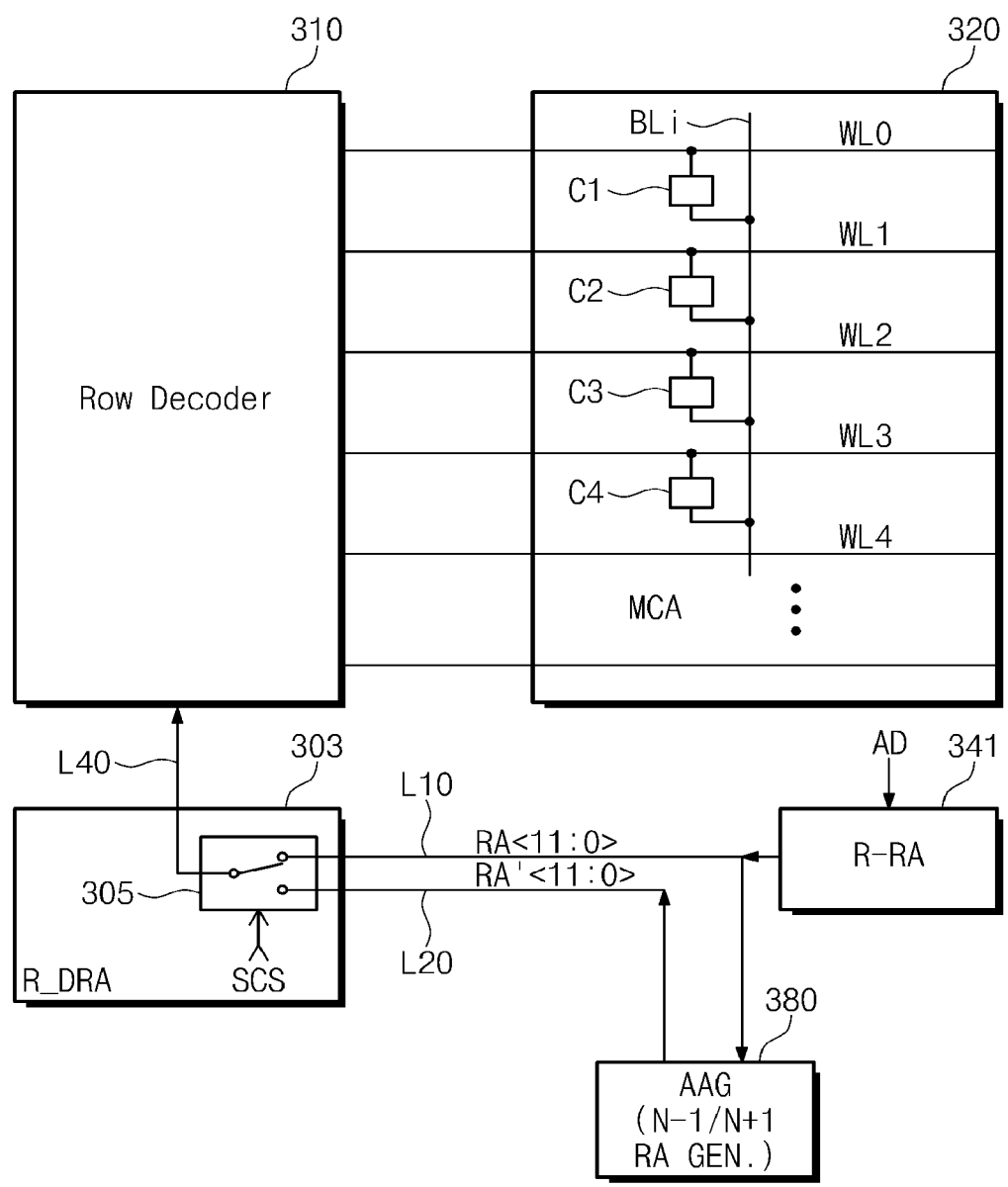
FIG. 33 is another exemplary schematic circuit block diagram of a DRAM of FIG. 14.

FIG. 33 is another exemplary schematic circuit block diagram of a DRAM of FIG. 14.

Referring to FIG. 33, the DRAM 300 includes an address input buffer 341, an adjacent row address generator 380, a row pre-decoder 303, a row decoder 310 and a memory cell array 320.

The memory cell array 320 may include a normal memory cell array and a spare memory cell array constituted by volatile memory cells.

The memory cell array 320 may include a plurality of memory cells of a matrix form of row and column. Each of memory cells C1, C2, C3 and C4 includes one access transistor and one storage capacitor. A gate of the access transistor is connected to a corresponding word line WLi. A drain of the access transistor is connected to a corresponding bit line BLi. A plurality of memory cells connected to the same word line forms a memory page.

A state of cell data stored in a memory cell (e.g., C1) is determined by the quantity of charges stored in the storage capacitor. Since charges stored in the storage capacitor are leaked as time passes, a refresh operation is needed which restores data before the state of the data is changed.

A refresh operation of the DRAM 300 is similar to a data read operation but is different from a data read operation in that it does not output data to the device outside.

A general refresh operation of DRAM is performed by changing a row address strobe signal RASB from logic 'high' to logic 'low' to apply it to the DRAM and driving a bit line sense amplifier sensing memory cell data after activating a word line corresponding to a row address to be refreshed.

The address input buffer 341 buffers a row address AD to output it through a line L10.

When a concentration row address concentratedly accessing a specific word line (e.g., WL2) of the memory cell array 320 is output from the address input buffer 341, the adjacent row address generator 380 generates row addresses RA'<11:0> of word lines physically adjacent to the specific word line through a line L20 using the concentration row address RA<11:0>.

The row pre-decoder 303 selectively inputs one of the row address RA<11:0> being output from the address input buffer 341 and the row addresses RA'<11:0> of adjacent word lines being output from the adjacent row address generator 380 through the switch 305. The row pre-decoder 303 pre-decodes a row address selectively being input through the switch embodied by a multiplexer to output it as a row pre-decoding signal through a line L40.

The row decoder 310 decodes the row pre-decoding signal to activate at least one of selected word lines of the memory cell array 320.

Since the row decoder 310 can activate word lines WL1 and WL3 physically adjacent to the word line concentratedly accessed when a specific word line (e.g., WL2) is concentratedly accessed, stress or disturbance from which memory cells connected to the adjacent word lines WL1 and WL3 will suffer is eased through a refresh operation. Thus, degradation of a data retention time characteristic of memory cells being sacrificed due to a concentration access may be prevented.

Figure 34:
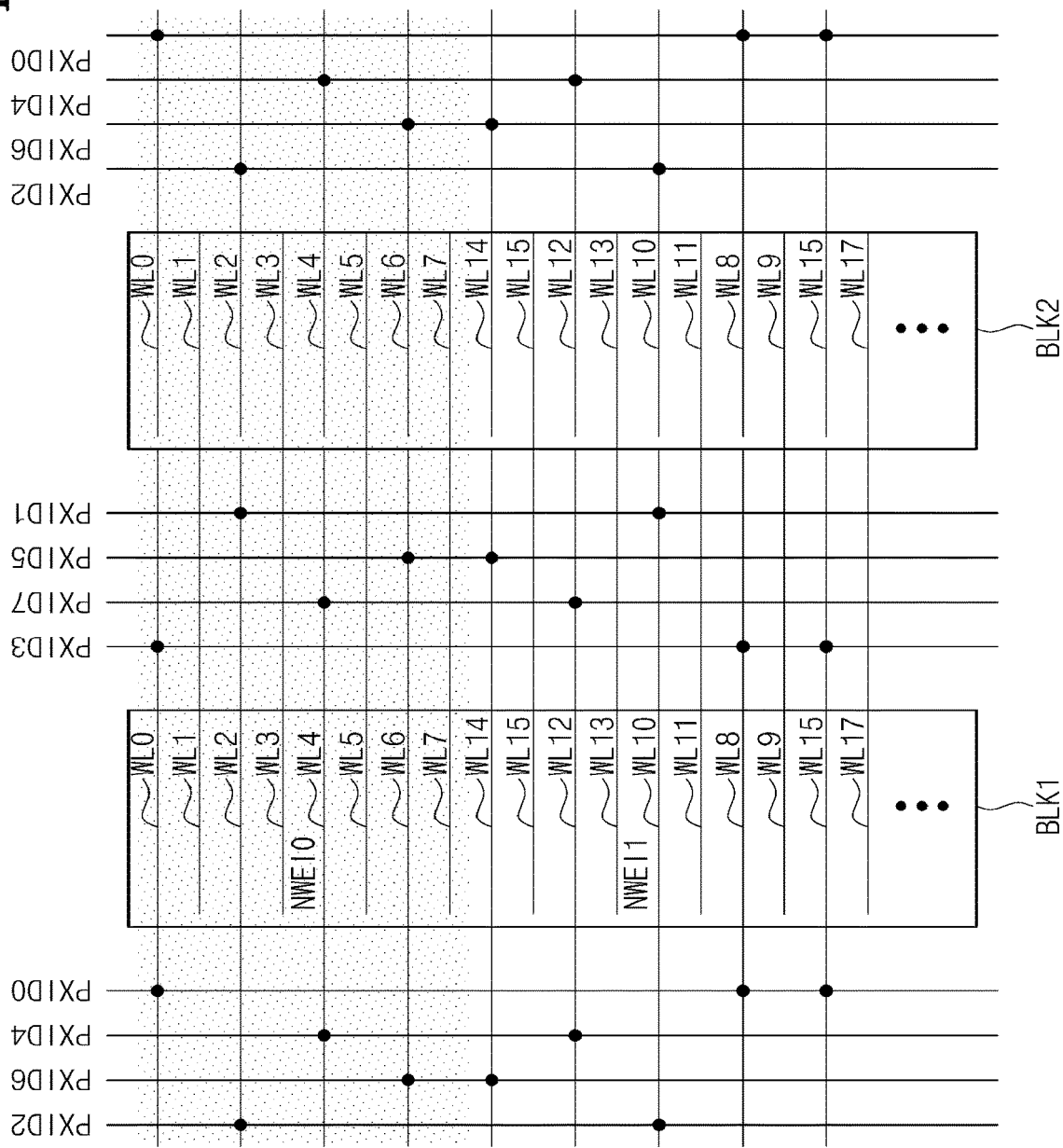
FIG. 34 is an exemplary drawing illustrating a case that a row address scrambling is applied to a DRAM of FIG. 14.

FIG. 34 is an exemplary drawing illustrating a case that a row address scrambling is applied to a DRAM of FIG. 14.

Referring to FIG. 34, an illustration of the order of a word line layout embodied by a word line scramble policy is illustrated. Word lines of WL0~WL7 are arranged in order but the rest are irregularly arranged in the order of WL14, WL12, WL13, WL10, WL11. WL8, WL9, WL15, and WL17. When a scramble is applied, the order of address of a word line physically arranged becomes different from the order of address being applied from the outside.

Thus, only if considering a scramble when a word line scramble is applied, row addresses physically adjacent to the specific row address can be accurately founded. If using only an external row address, it is difficult to find physically adjacent row addresses. To accurately generate physically adjacent, it is necessary to consider a word line scramble due to a core layout situation. Normal word line enable signals NWEI0 and NWEI1 and a sub word line signal PXIDi illustrated in FIG. 34 are illustrated in FIG. 29.

Figure 39:
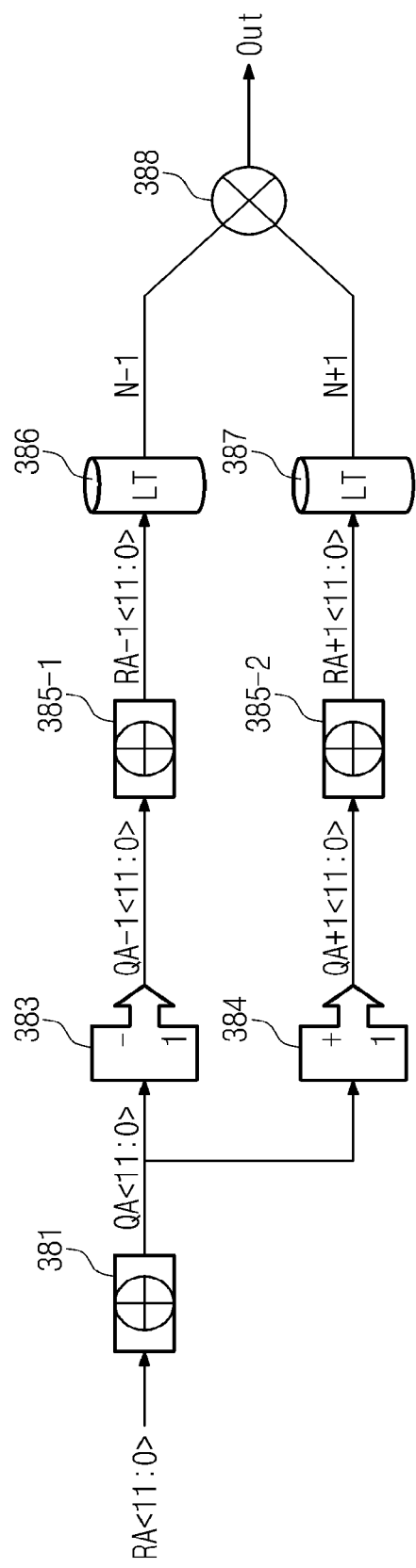
FIG. 39 is a detailed circuit block diagram illustrating still another example of an adjacent row address generator of FIG. 33.
Figure 41:
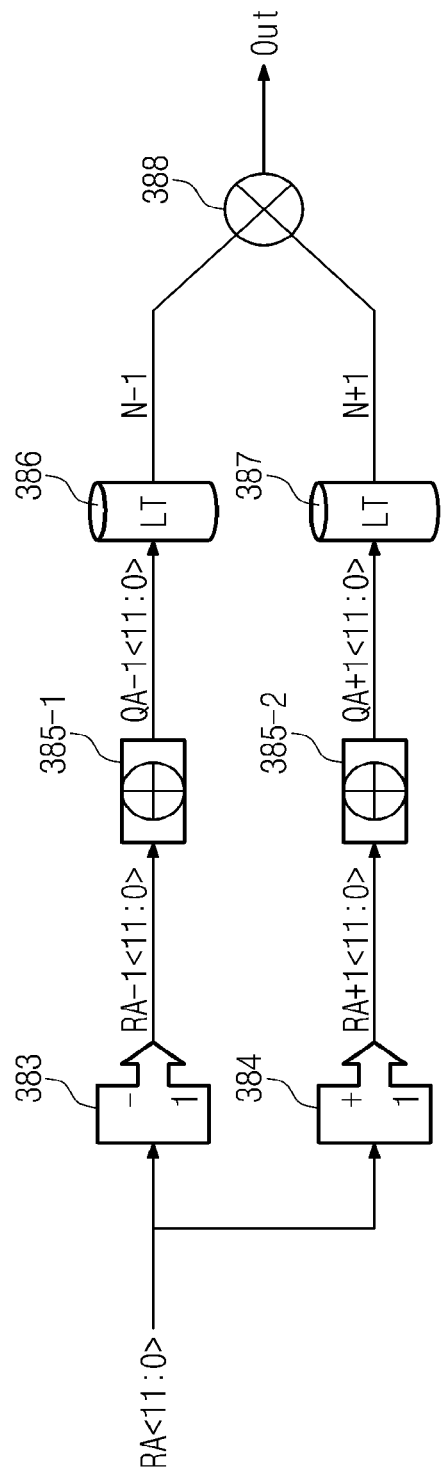
FIG. 41 is a detailed circuit block diagram illustrating an example of an adjacent row address generator of FIG. 40.

In FIG. 39 and FIG. 41 which will be described later, a scramble circuit processing a word line scramble may be internally included in the adjacent row address generator 380.

An illustration of the row pre-decoder 303 of FIG. 33 is the same as that illustrated in FIG. 28.

The switch 305 illustrated in FIG. 33 is omitted in the row pre-decoder 303 illustrated in FIG. 28. However, the switch 305 may be installed at an input stage of the row pre-decoder.

An illustration of the row decoder 310 is the same as that illustrated in FIG. 29.

Figure 35:
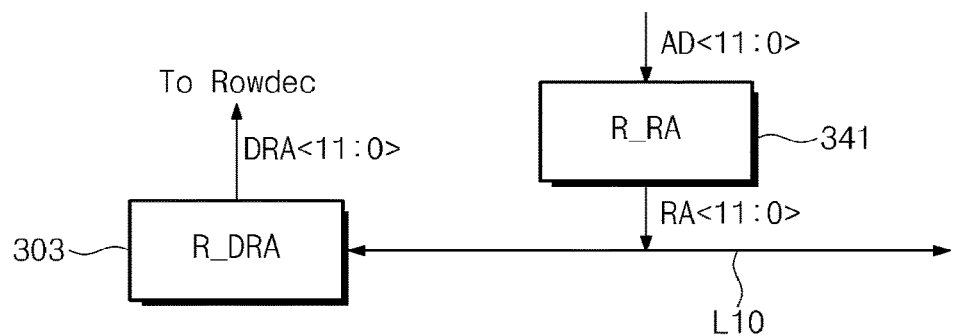
FIG. 35 is an exemplary block diagram illustrating a general row address pass circuit block diagram according to certain embodiment.

FIG. 35 is an exemplary block diagram illustrating a general row address pass circuit block diagram according to certain embodiments.

Referring to FIG. 35, a row address AD<11:0> applied from the outside is applied to an address input buffer R_RA 341 through an input buffer and an address flip flop. The address input buffer 341 latches the row address in response to an internal signal generated by active command information. The latched row address RA<11:0> is applied to a pre-decoder R_DRA 303 located at each memory bank through a line L10 which is a global line. The pre-decoder R_DRA 303 pre-decodes the row address RA<11:0> to apply a pre-decoded row address DRA<11:0> to a row decoder Rowdec 310.

In this case, when a concentration row address concentratedly accessing a specific word line (e.g., WL2) of the memory cell array 320 is output from the address input buffer 341, it is difficult that the circuit of FIG. 35 activates word lines physically adjacent to the specific word line.

Figure 36:
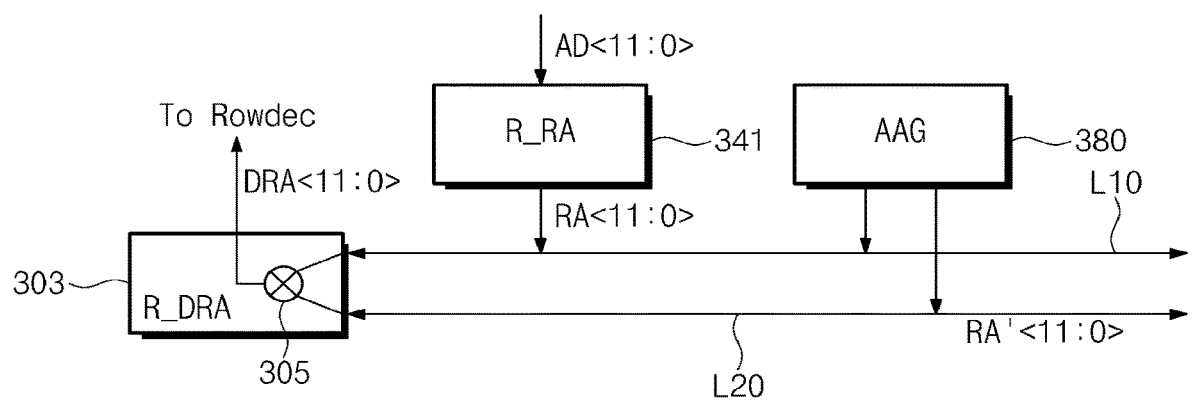
FIG. 36 is an exemplary block diagram illustrating a row address pass circuit block diagram in accordance with FIG. 33.

Thus, an improved row address path circuit block illustrated in FIG. 36 is prepared.

FIG. 36 is an exemplary block diagram illustrating a row address pass circuit block diagram in accordance with FIG. 33.

Referring to FIG. 36, an adjacent row address generator AAG 380 connected to an additional global line L20 is installed.

The address input buffer 341 buffers a row address AD being input from the outside to output a row address RA<11:0> through the line L10.

When a concentration row address concentratedly accessing a specific word line (e.g., WL2) of the memory cell array 320 is output from the address input buffer 341, the AAG 380 outputs row addresses RA'<11:0> of word lines physically adjacent to the specific word line through the line L20.

The row pre-decoder 303 selectively receives one of the row address RA<11:0> being output from the address input buffer 341 and row addresses RA'<11:0> of the adjacent word lines being output from the AAG 380 through the multiplexer 305. The row pre-decoder 303 pre-decodes the selectively received row address to apply the pre-decoded row address to the row decoder 310 as a row pre-decoding signal.

In the case that a concentration access detection signal SCS being applied when a specific word line of the memory cell array 320 is concentratedly accessed is activated, the multiplexer 305 of the row pre-decoder 303 selects a second input being applied through the second global line L20. In case of a normal operation that a read/write operation and a standby operation are performed, the row pre-decoder 303 pre-decodes the row address RA<11:0>. Accordingly, a word line corresponding to an input row address applied from the outside is enabled or activated.

The row address RA'<11:0> is pre-decoded in an operation mode caring memory cells being sacrificed by a concentration access.

In the case that a specific word line (e.g., WL2 of FIG. 33) is concentratedly accessed, the row decoder 310 can activate word lines WL1 and WL3 physically adjacent to the word line being concentratedly accessed. Thus, stress or disturbance from which memory cells connected to the adjacent word lines WL1 and WL3 suffer may be eased.

Row addresses of word lines adjacent to a word line being concentratedly accessed may include a high rank adjacent row address and a low rank adjacent row address.

The adjacent word line WL1 may be enabled by the high rank adjacent row address. The adjacent word line WL3 may be enabled by the low rank adjacent row address.

Figure 37:
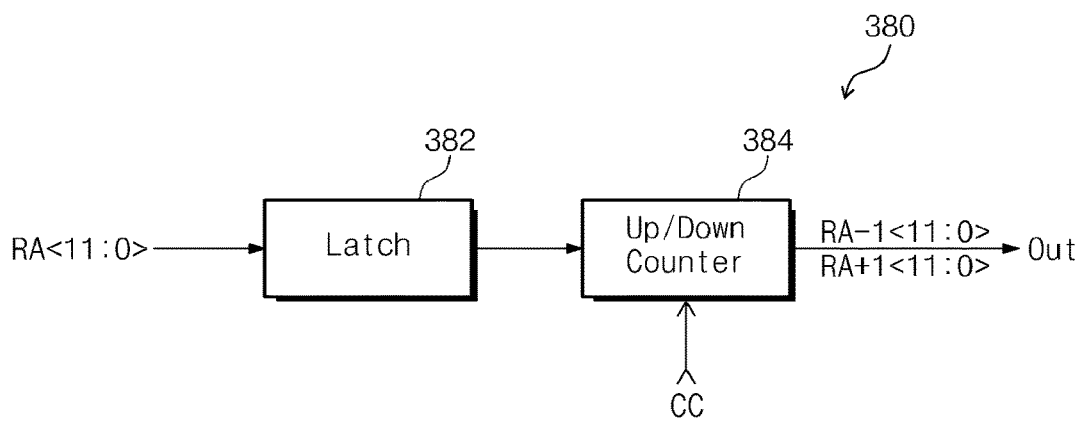
FIG. 37 is a detailed circuit block diagram illustrating an example of an adjacent row address generator of FIG. 33.

FIG. 37 is a detailed circuit block diagram illustrating an example of an adjacent row address generator of FIG. 33.

Referring to FIG. 37, the adjacent row address generator 380 includes a latch 382 and an up/down counter 384.

The latch 382 latches the row address RA<11:0>.

The up/down counter 384 increasingly or decreasingly counts a bit value of the latched row address according to a counting control signal CC to output first and second adjacent row addresses RA−1<11:0> and RA+1<11:0> to an output stage.

Figure 38:
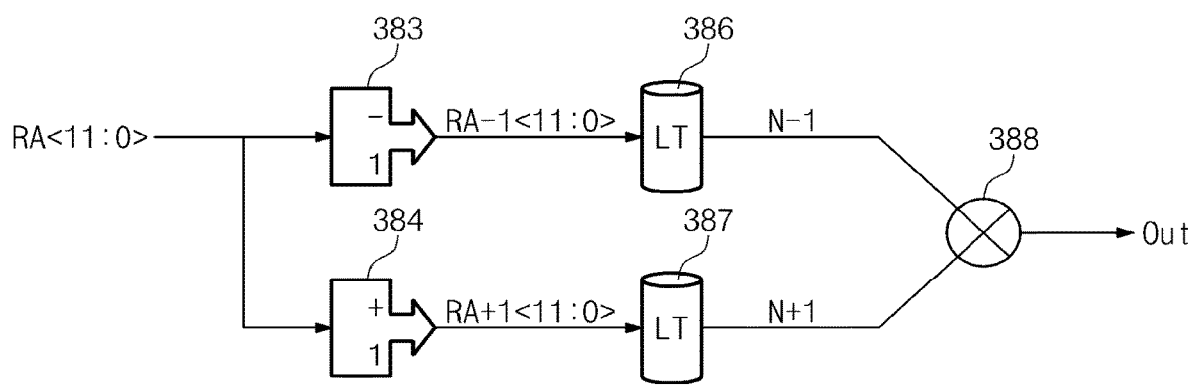
FIG. 38 is a detailed circuit block diagram illustrating another example of an adjacent row address generator of FIG. 33.

FIG. 38 is a detailed circuit block diagram illustrating another example of an adjacent row address generator of FIG. 33.

Referring to FIG. 38, the adjacent row address generator 380 may include first and second counters 383 and 384, first and second latches 386 and 387 and a multiplexer 388.

The first counter 383 decreasingly counts a bit value of the row address to output the first adjacent row address RA−1<11:0>. In the case that the row address is proved to concentratedly access a specific word line, the row address becomes a concentration row address.

The second counter 384 increasingly counts a bit value of the row address to output the second adjacent row address RA+1<11:0>.

The first latch 386 latches an output address of the first counter 383 and the second latch 387 latches an output address of the second counter 384.

The multiplexer 388 that functions as a select switch multiplexes outputs of the first and second latches 386 and 387.

In the circuits of FIGS. 37 and 38, it was described that adjacent row addresses are generated using a concentration row address while a word line scramble is not considered.

In FIG. 39, it will be described that adjacent row addresses are generated considering a word line scramble.

FIG. 39 is a detailed circuit block diagram illustrating still another example of an adjacent row address generator of FIG. 33.

Referring to FIG. 39, scramblers 381, 385-1 and 385-2 are installed in addition to the circuit construction of FIG. 38.

The adjacent row address generator 380 may include a scrambler 381 scrambling the concentration row address according to a scramble policy set, a first counter 383 decreasingly counting a bit value of the scrambled concentration row address to output the first adjacent row address and a second counter 384 increasingly counting a bit value of the scrambled concentration row address to output the second adjacent row address.

The adjacent row address generator 380 may also include a first bank scrambler 385-1 scrambling an output address of the first counter to apply it to a corresponding memory bank, a second bank scrambler 385-2 scrambling an output address of the second counter to apply it to the memory bank, a first latch 386 latching an output address of the first bank scrambler 385-1 and a second latch 387 latching an output address of the second bank scrambler 385-2.

The adjacent row address generator 380 may also include a multiplexer 388 multiplexing outputs of the first and second latches 386 and 387 to output them to an output stage.

In FIG. 39, a row address QA<11:0> which takes a scramble into account is generated making use of the scrambler 381 and a QA−1 address and a QA+1 address may be generated by counting −1 and +1 making use of the row address QA<11:0>. To retransform the QA−1 address and the QA+1 address into a row address that can be used in each memory bank, a scrambler is reapplied. An RA−1 address and an RA+1 address are obtained through the reapplied scramblers 385-1 and 385-2.

Figure 40:
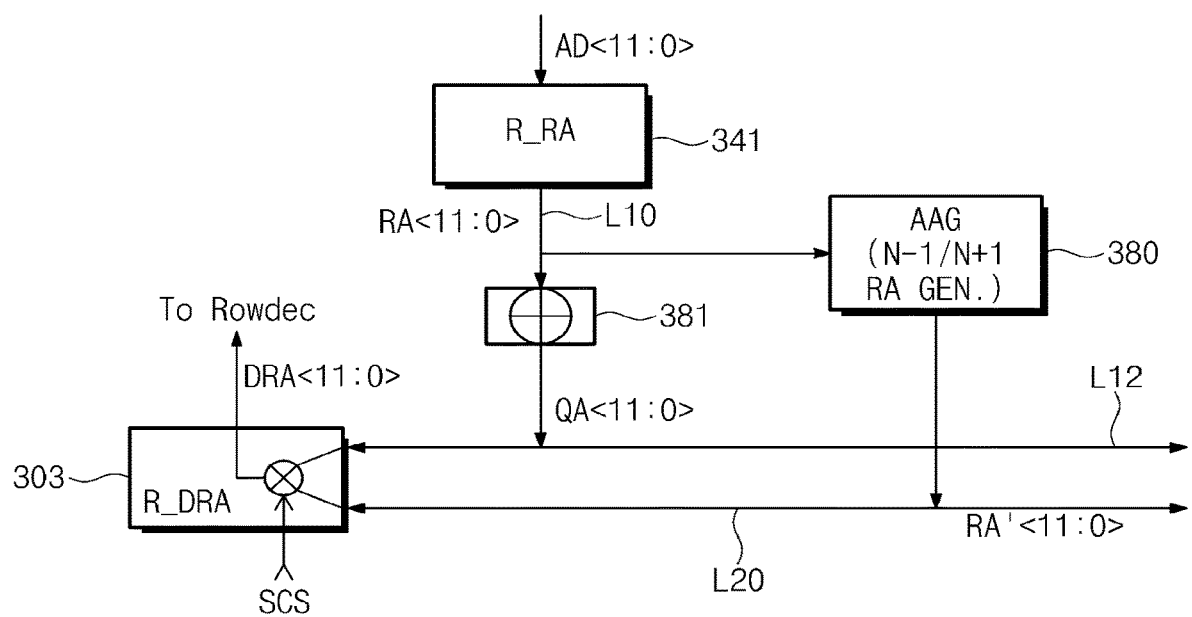
FIG. 40 is a block diagram illustrating a modified example of FIG. 36.

FIG. 40 is a block diagram illustrating a modified example of FIG. 36.

Referring to FIG. 40, unlike FIG. 36, a scrambler 381 is installed on a main address path.

In the case that the scrambler 381 is basically installed, the adjacent row address generator 380 may be constituted like FIG. 41.

FIG. 41 is a detailed circuit block diagram illustrating an example of an adjacent row address generator of FIG. 40.

Referring to FIG. 41, a circuit construction of FIG. 41 is the same as the circuit construction of FIG. 39 without the scrambler 381.

In FIG. 41, the reason why the scrambler 381 of FIG. 39 is removed is that the scrambler 381 of FIG. 40 performs a function of the scrambler 381 of FIG. 39.

Figure 42:
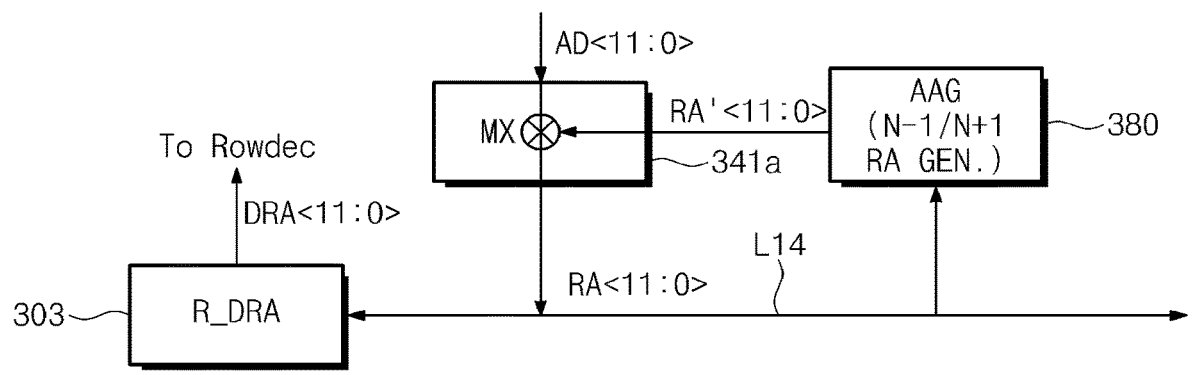
FIG. 42 is a block diagram illustrating another modified example of FIG. 36.

FIG. 42 is a block diagram illustrating another modified example of FIG. 36.

Referring to FIG. 42, a single global line L14 merging the first and second global lines L10 and L20 illustrated in FIG. 36 into one is installed.

An input of the adjacent row address generator 380 is connected to the single global line L14.

An address input buffer 341a may include a multiplexer MX for selectively outputting the concentration row address or row addresses of the adjacent word lines.

In FIG. 42, the multiplexer MX is installed inside the address input buffer 301a but the inventive concept is not limited thereto. For example, the multiplexer MX may be installed outside the address input buffer 301a.

Like FIG. 42, if sharing an RA line without additionally including an RA1 line, the burden of line arrangement is lightened.

Figure 43:
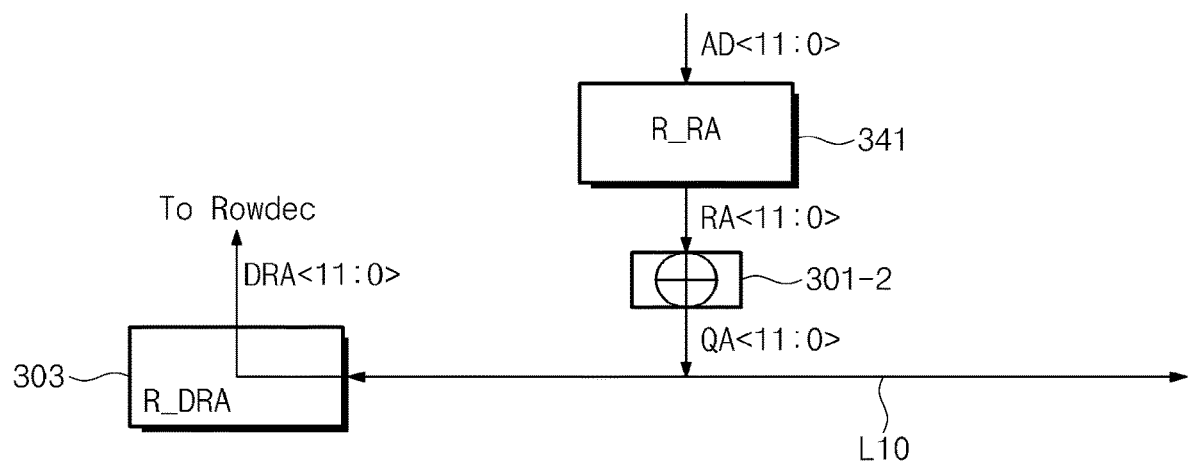
FIG. 43 is a block diagram illustrating still another modified example of FIG. 36.

FIG. 43 is a block diagram illustrating still another modified example of FIG. 36.

Referring to FIG. 43, a circuit construction in which the adjacent row address generator 380 is removed is illustrated.

In this case, adjacent row addresses (N−1/N+1 addresses) are applied from the outside. Thus, it is not necessary to additionally provide the adjacent row address generator 380 and it is only needed to consider a word line scramble processing when necessary. A scrambler 301-2 which is a word line scramble logic is installed on a main address path. In the case that it is necessary to consider a scramble, a scramble due to the scrambler 301-2 has to be applied and in the case that it is not necessary to consider a scramble, the scrambler 301-2 may be disabled.

Since the circuit of FIG. 43 only needs to consider whether a scramble exists or not, a circuit construction is comparatively simple.

As described above, row addresses physically adjacent to a specific row address are accurately obtained.

If a specific address is repeated more than the previously set number of times (e.g., 100,000), an address concentration is detected by a monitoring operation of the monitor 230 of FIG. 14.

When an address concentration is detected, as one of concentration address caring methods of improving a data retention characteristic of memory cells connected to adjacent word lines, a refresh performing method may be implemented.

By using the adjacent row address generator, stress or disturbance from which memory cells connected to word lines adjacent to an access concentrated word line will suffer may be eased by more frequently performing refresh operation. Thus, when an access concentration occurs, cell data corruption of a semiconductor memory device is prevented or eased and thereby read operation reliability of the semiconductor memory device is improved.

According to some embodiments, by performing an access concentration decrease management, even if an access concentration occurs in a specific memory area, cell data corruption of a volatile semiconductor memory is prevented or eased.

According to some embodiments, when an address concentration occurs, stress or disturbance from which memory cells connected to word lines adjacent to any word line or memory cells connected to word lines adjacent to any bit line will suffer may be eased. Thus, when an address concentration occurs, cell data corruption of a semiconductor memory is prevented or eased.

According to some embodiments, when a spare line is concentratedly accessed, memory cells connected to spare lines adjacent to the spare line may be effectively cared to ease stress or disturbance.

According to some embodiments, since when a specific word line is concentratedly accessed, row addresses of word lines physically adjacent to the word line concentratedly accessed can be generated, stress or disturbance from which corresponding memory cells will suffer is eased through a refresh operation. Thus, degradation of data retention time characteristic of memory cells is prevented.

The foregoing is illustrative of the disclosure and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. The present disclosure is defined by the following claims, with equivalents of the claims to be included therein.

What is claimed is:

1. A semiconductor memory device comprising:
   a memory cell array comprising first memory cells connected to a first word line and second memory cells connected to a second word line, the second word line being physically adjacent to the first word line;
   an address input buffer configured to store a first row address addressing the first word line concentrically accessed by the first row address;
   an adjacent row address generator configured to generate a second row address addressing the second word line based on the first row address;
   a pre-decoder configured to select one of the first row address output from the address input buffer and the second row address output from the adjacent row address generator; and
   a row decoder configured to activate a selected word line among the first word line and the second word line, the selected word line corresponding to the selected one of the first row address and the second row address,
   wherein the second memory cells are refreshed when the second row address is selected.

2. The semiconductor memory device of claim 1, wherein the pre-decoder selects the one of the first row address and the second row address in response to a number of accesses on the first word line exceeding a threshold number.

3. The semiconductor memory device of claim 1, wherein the pre-decoder selects the first row address as the selected one of the first row address and the second row address in response to the first word line being most concentrically accessed.

4. The semiconductor memory device of claim 1, wherein the adjacent row address generator comprises:
   a latch configured to latch the first row address; and
   a counter configured to increasingly or decreasingly count a bit value of the first row address latched by the latch, and to output the second row address.

5. The semiconductor memory device of claim 1, wherein the adjacent row address generator comprises:
   a first counter configured to decreasingly count a bit value of the first row address, and to output a first adjacent row address;
   a second counter configured to increasingly count a bit value of the first row address, and to output a second adjacent row address;

a first latch configured to latch the first adjacent row address output from the first counter;

a second latch configured to latch the second adjacent row address output from the second counter; and a multiplexer configured to output one of the first adjacent row address and the second adjacent row address as the second row address.

6. The semiconductor memory device of claim 1, wherein the adjacent row address generator comprises:

a scrambler configured to scramble the first row address according to a predetermined scramble policy;

a first counter configured to decreasingly count a bit value of the scrambled first row address to output a first adjacent row address;

a second counter configured to increasingly count a bit value of the scrambled first row address to output a second adjacent row address;

a first bank scrambler configured to scramble an output address of the first counter to apply it to a corresponding memory bank;

a second bank scrambler configured to scramble an output address of the second counter to apply it to the corresponding memory bank;

a first latch configured to latch an output address of the first bank scrambler;

a second latch configured to latch an output address of the second bank scrambler; and a multiplexer configured to output one of the output addresses of the first and second latches as the second row address.

7. The semiconductor memory device of claim 1, wherein in a case where the first row address is word line scrambled through an address applying path, the adjacent row address generator comprises:

a first counter configured to decreasingly count a bit value of the first row address to output a first adjacent row address;

a second counter configured to increasingly count a bit value of the first row address to output a second adjacent row address;

a first scrambler configured to scramble an output address of the first counter;

a second scrambler configured to scramble an output address of the second counter;

a first latch configured to latch an output address of the first scrambler;

a second latch configured to latch an output address of the second scrambler; and a multiplexer configured to output one of the output addresses of the first and second latches as the second row address.

8. The semiconductor memory device of claim 7, further comprising:

a main scrambler connected between the address input buffer and configured to perform an address scramble on the first row address.

9. A semiconductor memory device comprising:

a memory cell array comprising first memory cells connected to a first word line and second memory cells connected to a second word line, the second word line being physically adjacent to the first word line; and an adjacent row address generator configured to generate an adjacent row address corresponding to the second word line based on a row address corresponding to the first word line when the first word line is concentrically accessed by the row address, wherein the adjacent row address is selected for refresh in response to a number of accesses on the first word line exceeding a threshold number or in response to the first word line being most concentrically accessed.

10. The semiconductor memory device of claim 9, wherein the adjacent row address generator comprises:

a latch configured to latch the row address; and a counter configured to increasingly or decreasingly count a bit value of the row address latched by the latch, and to output the adjacent row address.

11. The semiconductor memory device of claim 9, wherein the adjacent row address generator comprises:

a first counter configured to decreasingly count a bit value of the row address, and to output a first adjacent row address;

a second counter configured to increasingly count a bit value of the row address, and to output a second adjacent row address;

a first latch configured to latch the first adjacent row address output from the first counter;

a second latch configured to latch the second adjacent row address output from the second counter; and a multiplexer configured to output one of the first adjacent row address and the second adjacent row address as the adjacent row address.

12. The semiconductor memory device of claim 9, wherein the adjacent row address generator comprises:

a scrambler configured to scramble the row address according to a predetermined scramble policy;

a first counter configured to decreasingly count a bit value of the scrambled row address to output a first adjacent row address;

a second counter configured to increasingly count a bit value of the scrambled row address to output a second adjacent row address;

a first bank scrambler configured to scramble an output address of the first counter to apply it to a corresponding memory bank;

a second bank scrambler configured to scramble an output address of the second counter to apply it to the corresponding memory bank;

a first latch configured to latch an output address of the first bank scrambler;

a second latch configured to latch an output address of the second bank scrambler; and a multiplexer configured to output one of the output addresses of the first and second latches as the adjacent row address.

13. The semiconductor memory device of claim 9, wherein in a case where the row address is word line scrambled through an address applying path, the adjacent row address generator comprises:

a first counter configured to decreasingly count a bit value of the row address to output a first adjacent row address;

a second counter configured to increasingly count a bit value of the row address to output a second adjacent row address;

a first scrambler configured to scramble an output address of the first counter;

a second scrambler configured to scramble an output address of the second counter;

a first latch configured to latch an output address of the first scrambler;

a second latch configured to latch an output address of the second scrambler; and a multiplexer configured to output one of the output addresses of the first and second latches as the adjacent row address.

14. The semiconductor memory device of claim 13, further comprising:
a main scrambler configured to perform an address scramble on the row address.

15. A semiconductor memory device comprising:
a memory cell array comprising first memory cells connected to a first word line and second memory cells connected to a second word line, the second word line being physically adjacent to the first word line; and
an adjacent row address generator configured to generate an adjacent row address corresponding to the second word line based on a row address corresponding to the first word line in response to a number of accesses on the first word line exceeding a threshold number; and
a row decoder configured to activate the second word line so that the second memory cells are refreshed in response to a refresh command provided from a memory controller when the number of accesses on the first word line exceeds the threshold number.

16. The semiconductor memory device of claim 15, wherein the adjacent row address generator comprises:
a latch configured to latch the row address; and
a counter configured to increasingly or decreasingly count a bit value of the row address latched by the latch, and to output the adjacent row address.

17. The semiconductor memory device of claim 15, wherein the adjacent row address generator comprises:
a first counter configured to decreasingly count a bit value of the row address, and to output a first adjacent row address;
a second counter configured to increasingly count a bit value of the row address, and to output a second adjacent row address;
a first latch configured to latch the first adjacent row address output from the first counter;
a second latch configured to latch the second adjacent row address output from the second counter; and
a multiplexer configured to output one of the first adjacent row address and the second adjacent row address as the adjacent row address.

* * * * *